US012764959B2

(12) United States Patent
Jung

(10) Patent No.: US 12,764,959 B2
(45) Date of Patent: Oct. 13, 2026

(54) SEMICONDUCTOR MEMORY DEVICE

(71) Applicant: SK hynix Inc., Icheon-si (KR)

(72) Inventor: Sung Wook Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 279 days.

(21) Appl. No.: 18/622,171

(22) Filed: Mar. 29, 2024

(65) Prior Publication Data

US 2025/0151270 A1 May 8, 2025

(30) Foreign Application Priority Data

Nov. 8, 2023 (KR) ........................ 10-2023-0153587

(51) Int. Cl.

| | |
|---|---|
| ***H01L 29/76*** | (2006.01) |
| ***H10B 41/10*** | (2023.01) |
| ***H10B 41/27*** | (2023.01) |
| ***H10B 41/40*** | (2023.01) |
| ***H10B 43/10*** | (2023.01) |
| ***H10B 43/27*** | (2023.01) |
| ***H10B 43/40*** | (2023.01) |

(52) U.S. Cl.

CPC ............. *H10B 43/27* (2023.02); *H10B 41/10* (2023.02); *H10B 41/27* (2023.02); *H10B 41/40* (2023.02); *H10B 43/10* (2023.02); *H10B 43/40* (2023.02)

(58) Field of Classification Search

CPC ........ H10B 43/27; H10B 41/10; H10B 41/40; H10B 43/10; H10B 41/27; H10B 43/35; H10B 41/35; H10B 63/34; H10B 41/41; H10B 12/00; H10B 10/00; H10B 63/10; H10B 41/00; H10B 20/25; H10B 20/20; H10B 12/10; H10B 63/00; H10B 69/00; H10B 12/30; H10B 12/20

See application file for complete search history.

(56) References Cited

U.S. PATENT DOCUMENTS

2010/0019310 A1* 1/2010 Sakamoto .............. H10D 30/69 257/324
2012/0195125 A1* 8/2012 Choe ...................... H10B 43/27 365/185.15
2021/0399112 A1* 12/2021 Lee ........................ H10B 43/35
2022/0254805 A1* 8/2022 Lee ........................ H10B 43/27
2022/0302138 A1 9/2022 Mitsuno et al.

FOREIGN PATENT DOCUMENTS

KR 1020220144187 A 10/2022

* cited by examiner

*Primary Examiner* — Niki H Nguyen

(74) *Attorney, Agent, or Firm* — WILLIAM PARK AND ASSOCIATES LTD.

(57) ABSTRACT

There is provided a semiconductor memory device and a method of manufacturing the same. The semiconductor memory device includes a first gate stacked body including a first channel hole, a second gate stacked body overlapping the first gate stacked body and including a second channel hole, a first memory layer extending along an inner wall of the first channel hole, a second memory layer extending along an inner wall of the second channel hole and including an end protruding into the first channel hole.

11 Claims, 31 Drawing Sheets

SEMICONDUCTOR MEMORY DEVICE

CROSS-REFERENCE TO RELATED APPLICATION

The present application claims priority under 35 U.S.C. § 119(a) to Korean patent application number 10-2023-0153587, filed in the Korean Intellectual Property Office on Nov. 8, 2023, which is incorporated herein by reference in its entirety.

BACKGROUND

1. Technical Field

Various embodiments of the present disclosure generally relate to an electronic device, and more particularly to a semiconductor memory device and a method of manufacturing the semiconductor memory device.

2. Related Art

Semiconductor memory devices may be applied not only to small-sized electronic devices but also to electronic devices in various fields such as vehicles, medical appliances, and data centers. Accordingly, there is an increasing demand for semiconductor memory devices.

The semiconductor memory device may include memory cells for storing data. In order to achieve high capacity in the semiconductor memory device, the development of technology for a three-dimensional (3D) semiconductor memory device including memory cells arranged in three dimensions is being actively conducted.

The 3D semiconductor memory device may include a plurality of conductive layers used as gate electrodes of a plurality of memory cells. When a gate stacked body including a plurality of conductive layers is formed, the degree of integration may be improved by increasing the number of stacks of conductive layers. As the number of stacks of conductive layers increases, the height of the gate stacked body may increase, and the stability of a manufacturing process may deteriorate. Accordingly, there is a limitation in increasing the number of stacks of conductive layers.

SUMMARY

An embodiment of the present disclosure may provide for a semiconductor memory device. The semiconductor memory device may include a first gate stacked body including a first channel hole, a second gate stacked body overlapping the first gate stacked body and including a second channel hole, a first memory layer extending along an inner wall of the first channel hole, a second memory layer extending along an inner wall of the second channel hole and including an end protruding into the first channel hole.

An embodiment of the present disclosure may provide for a method of manufacturing a semiconductor memory device. The method may include forming a first memory module, wherein the first memory module includes a lower structure, a first gate stacked body over the lower structure, a first channel hole passing through the first gate stacked body, and a first memory layer extending along a surface of the first channel hole, forming a second memory module, wherein the second memory module includes a second gate stacked body having a first surface and a second surface facing opposite directions, a second channel hole passing through the second gate stacked body, a second memory layer extending along an inner wall of the second channel hole and including an end protruding beyond the first surface of the second gate stacked body, and a sacrificial pillar disposed in a central region of the second channel hole opened by the second memory layer, stacking the second memory module over the first memory module so that the end of the second memory layer of the second memory module is inserted into the first channel hole of the first memory module, removing the sacrificial pillar to expose the second memory layer, etching a bottom surface of the first memory layer and a bottom surface of the second memory layer to expose the lower structure, and forming a channel layer that contacts an exposed portion of the lower structure and extends along an inner wall of the first memory layer and an inner wall of the second memory layer.

DETAILED DESCRIPTION

Specific structural or functional descriptions of embodiments according to the concept of the present disclosure, disclosed in the present specification or application, are exemplified to explain the embodiments according to the concept of the present disclosure. The embodiments according to the concept of the present disclosure should not be construed as being limited to embodiments described in the present specification or application, and may be variously modified and replaced with other equivalent embodiments.

It will be understood that, although the terms "first," "second," etc. may be used herein to describe various elements, these elements should not be limited by these terms. These terms are only used to distinguish one element from another element, and the order or number of components is not limited by the terms. In addition, it is not construed as limiting the number of components unless there is a special limitation on components expressed in singular or plural numbers. It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Various embodiments of the present disclosure are directed to a three-dimensional (3D) semiconductor memory device and a method of manufacturing the semiconductor memory device, which can improve the degree of integration and operational reliability.

Figure 1A:
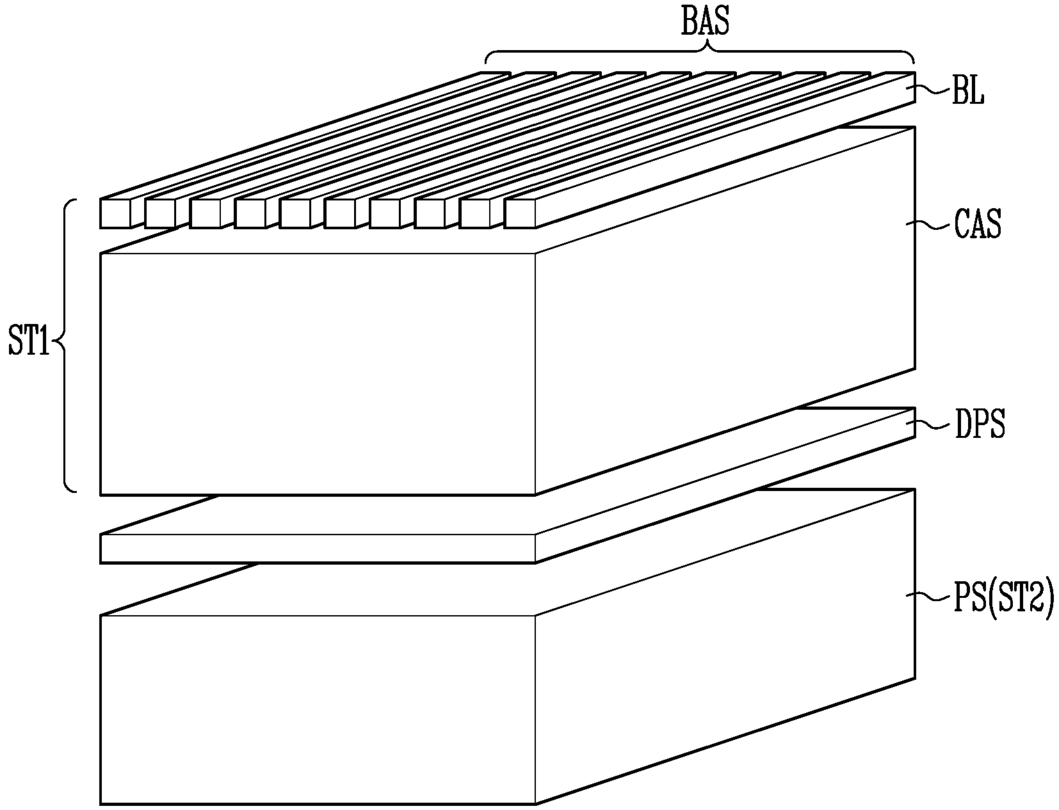
FIGS. 1A and 1B are views illustrating a semiconductor memory device according to embodiments of the present disclosure.
Figure 1B:
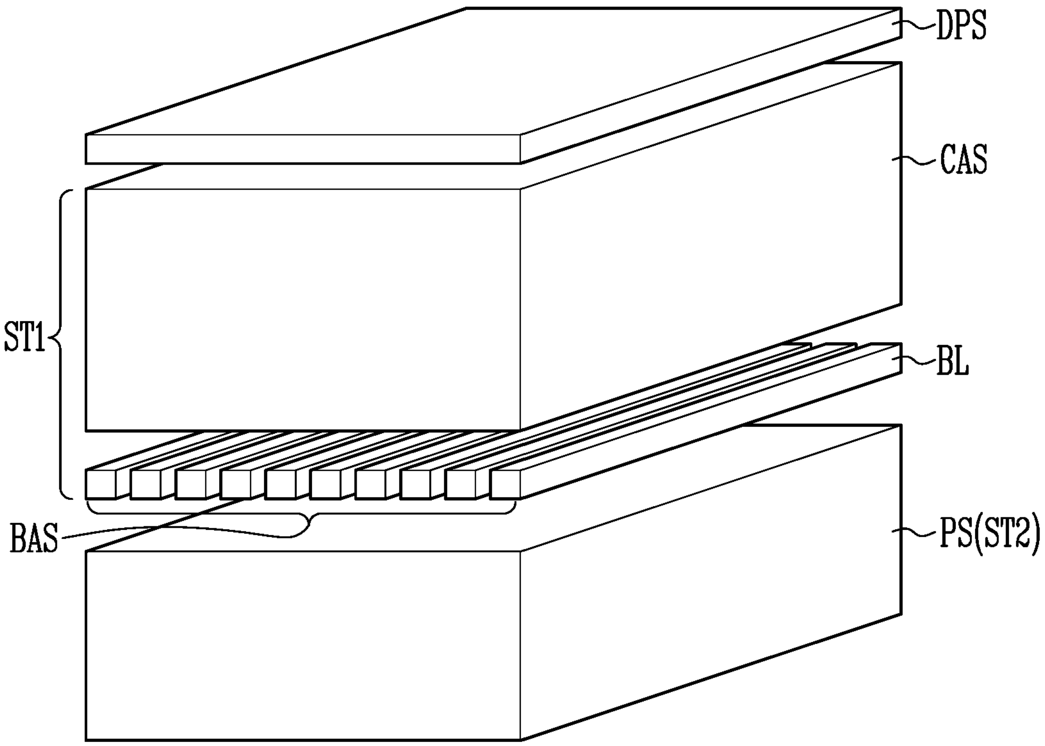

FIGS. 1A and 1B are views illustrating a semiconductor memory device according to embodiments of the present disclosure.

Referring to FIGS. 1A and 1B, the semiconductor memory device may include a first structure ST1, a second structure ST2, and a doped semiconductor structure DPS. The first structure ST1 may include a cell array structure CAS and a bit line array structure BAS, and the second structure ST2 may include a peripheral circuit structure PS.

The bit line array structure BAS may include a plurality of bit lines BL.

The cell array structure CAS may be disposed between the bit line array structure BAS and the doped semiconductor structure DPS. The cell array structure CAS may include a memory block. The memory block may include a plurality of memory cell strings electrically connected to the bit line array structure BAS and the doped semiconductor structure DPS. Each memory cell string may include a channel layer extending from the doped semiconductor structure DPS towards the bit line BL corresponding thereto.

The doped semiconductor structure DPS may include a doped semiconductor layer implemented as at least one layer. The doped semiconductor structure DPS may include at least one of an n-type impurity and a p-type impurity. The doped semiconductor structure DPS may be used as at least one of a common source region and a well region. The doped semiconductor structure DPS may include at least one of a first conductive doped region including the n-type impurity as a majority carrier and a second conductive doped region including the p-type impurity as a majority carrier. The first conductive doped region may be provided as a common source region, and the second conductive doped region may be provided as a well region.

The peripheral circuit structure PS may perform a program operation of storing data in a memory cell, a read operation of outputting data stored in the memory cell, and an erase operation of erasing data stored in the memory cell. In an embodiment, the peripheral circuit structure PS may include an input/output circuit, a control circuit, a voltage generation circuit, a row decoder, a column decoder, a page buffer, etc. In detail, the peripheral circuit structure PS may include a plurality of transistors, capacitors, resistors, etc.

The peripheral circuit structure PS may include a region overlapping the doped semiconductor structure DPS, the cell array structure CAS, and the bit line array structure BAS. The peripheral circuit structure PS may be adjacent to the doped semiconductor structure DPS, as illustrated in FIG. 1A, or may be adjacent to the bit line array structure BAS, as illustrated in FIG. 1B.

The cell array structure CAS may be coupled to the peripheral circuit structure PS via a plurality of select lines, a plurality of word lines, the bit line array structure BAS, and the doped semiconductor structure DPS. Although not illustrated in the drawings, each of the first structure ST1 and the second structure ST2 may include at least one of a plurality of interconnections, a plurality of contacts, and a plurality of conductive bonding pads required for electrical connection.

The cell array structure CAS may include a 3D memory cell array structure including memory cells arranged in three dimensions. The cell array structure CAS may include a multi-stacked body including gate stacked bodies that are stacked to overlap each other.

Figure 2:
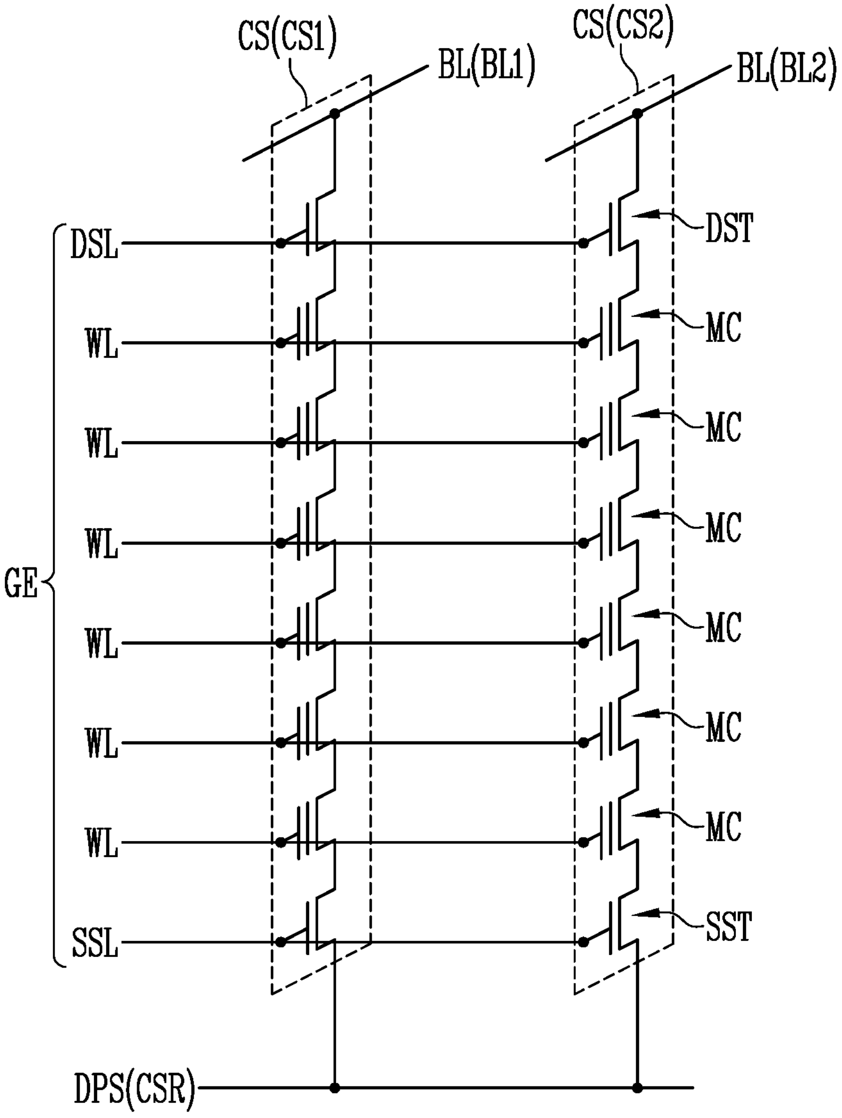
FIG. 2 is a circuit diagram of a memory cell array according to an embodiment of the present disclosure.

FIG. 2 is a circuit diagram of a memory cell array according to an embodiment of the present disclosure.

Referring to FIG. 2, the memory cell array may include a plurality of memory cell strings CS. Each memory cell string CS may include at least one source select transistor SST, a plurality of memory cells MC, and at least one drain select transistor DST. The memory cells MC may be connected in series between the source select transistor SST and the drain select transistor DST. The source select transistor SST, the plurality of memory cells MC, and the drain select transistor DST may be connected in series by a channel layer.

The channel layer may be used as a channel region of the memory cell string CS. The channel layer may be electrically connected to a bit line BL corresponding thereto, and may be electrically connected to a common source region CSR of a doped semiconductor structure DPS. A voltage for discharging the potential of the channel region of the memory cell string CS may be applied to the common source region CSR. A voltage for precharging the channel region of the memory cell string CS may be applied to the bit line BL.

Gate electrodes GE of the source select transistor SST, the plurality of memory cells MC, and the drain select transistor DST may be formed of conductive layers of a multi-stacked body. In an embodiment, the conductive layers of the multi-stacked body may correspond to conductive layers 113, 123A, and 123B illustrated in FIGS. 3A and 3B. The conductive layers of the multi-stacked body may include a source select line SSL provided as the gate electrode of the source select transistor SST, a plurality of word lines WL provided as the plurality of gate electrodes of the plurality of memory cells MC, and a drain select line DSL provided as the gate electrode of the drain select transistor DST.

A plurality of memory cell strings CS of two or more rows may be connected in parallel to each of the gate electrodes GE. The plurality of memory cell strings CS of two or more rows, connected to the same gate electrode GE, may be coupled to different bit lines BL, respectively. In an embodiment, the plurality of memory cell strings CS may include a memory cell string CS1 in a first row and a memory cell string CS2 in a second row, which are controlled by the same gate electrode GE. The memory cell string CS1 in the first row may be controlled by the first bit line BL1, and the memory cell string CS2 in the second row may be controlled by the second bit line BL2. Hereinafter, although the structure of the semiconductor memory device will be described based on the embodiment in which memory cell strings CS of two rows are connected in parallel to each gate electrode GE, an embodiment of the present disclosure is not limited thereto. The number of rows of the memory cell strings connected to the same gate electrode GE may be variously designed.

Figure 3A:
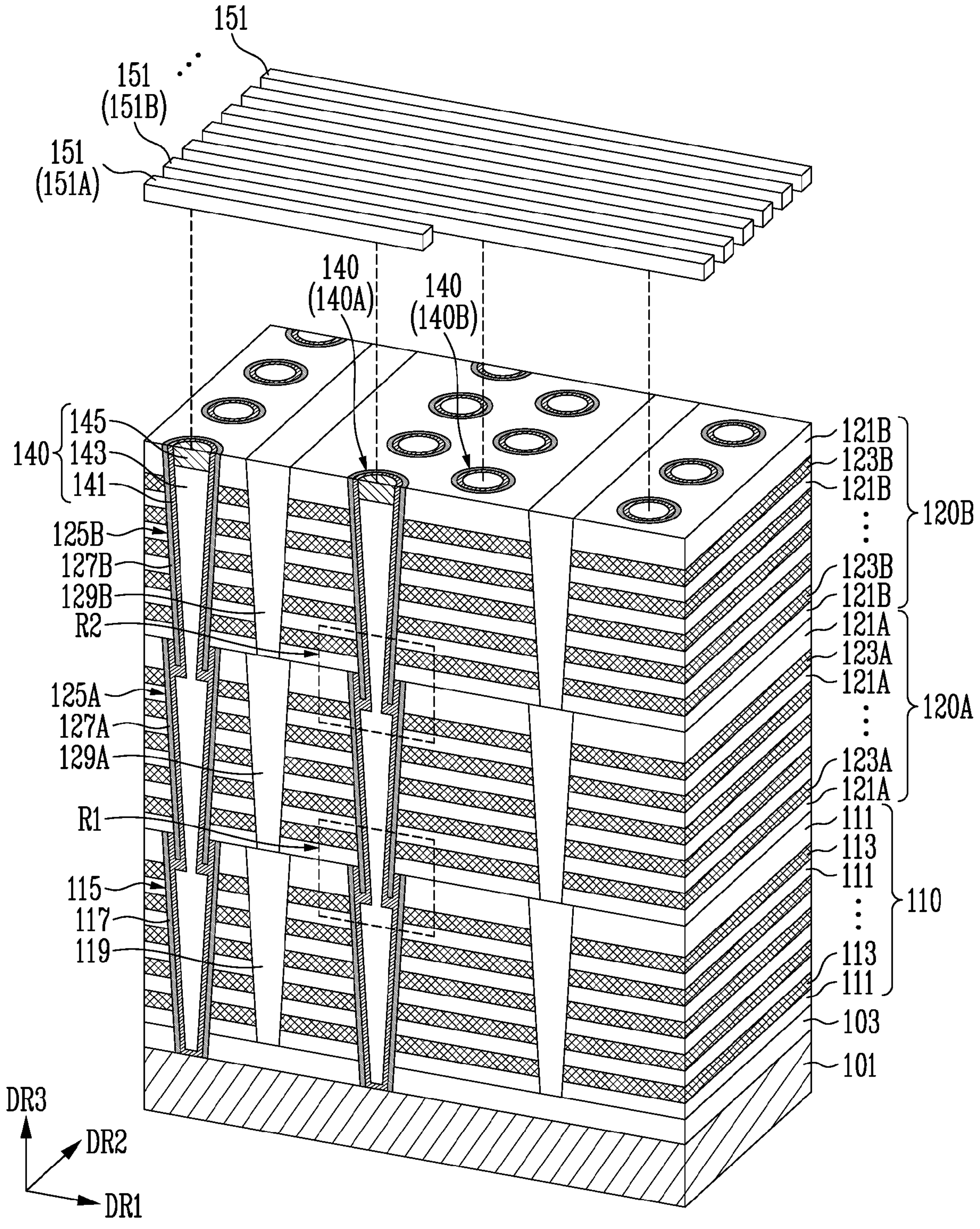
FIGS. 3A and 3B are views illustrating a first structure according to embodiments of the present disclosure.
Figure 3B:
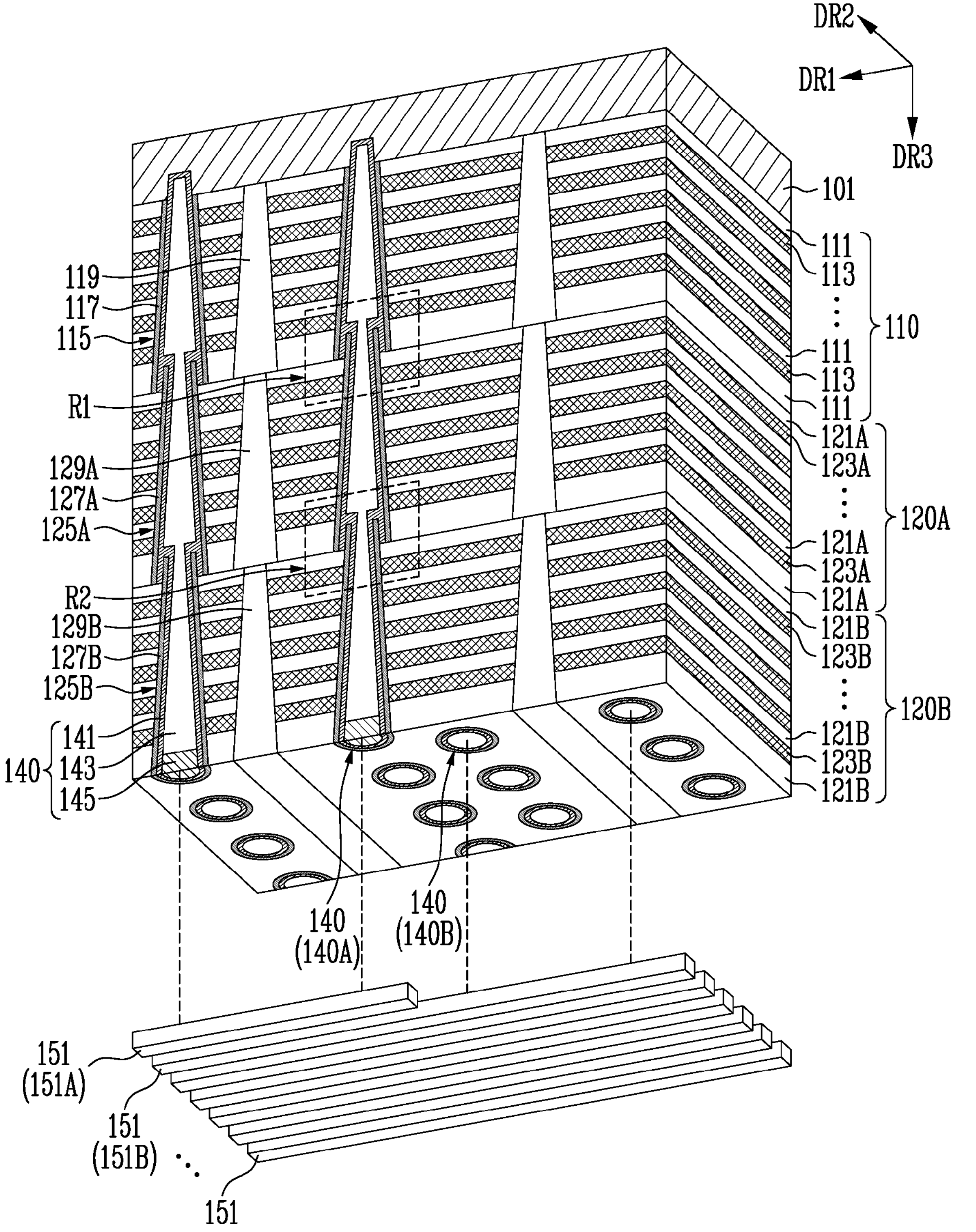

FIGS. 3A and 3B are views illustrating a first structure according to embodiments of the present disclosure.

Referring to FIGS. 3A and 3B, the first structure may include a doped semiconductor layer 101, a plurality of bit lines 151, and a plurality of memory cell strings defined along a plurality of channel pillars 140.

The doped semiconductor layer 101 may be included in the doped semiconductor structure DPS, illustrated in FIG. 1A, 1B or 2, and may include at least one of an n-type impurity and a p-type impurity.

The plurality of bit lines 151 may extend in a first direction DR1, and may be arranged to be spaced apart from each other in a second direction DR2. The first direction DR1 and the second direction DR2 may be directions intersecting each other on an XY plane. The plurality of bit lines 151 may be spaced apart from the doped semiconductor layer 101 in a third direction DR3. The third direction DR3 may be a Z-axis direction intersecting the XY plane. The plurality of bit lines 151 may include first bit lines 151A and second bit lines 151B that are alternately arranged in the second direction DR2.

The plurality of channel pillars 140 may be arranged in a plurality of columns and a plurality of rows. Each column may include channel pillars 140 arranged in a line in the first direction DR1, and each row may include channel pillars 140 arranged in a line in the second direction DR2. The plurality of channel pillars 140 may include first channel pillars 140A in a first row and second channel pillars 140B in a second row. Each of the first channel pillars 140A in the first row may be electrically connected to a corresponding first bit line 151A, and each of the second channel pillars 140B in the second row may be electrically connected to a corresponding second bit line 151B.

Each channel pillar 140 may include a channel layer 141, a core insulating layer 143, and a capping layer 145. The channel layer 141 may be coupled to the doped semiconductor layer 101 and may extend in the third direction DR3 towards the bit line 151 corresponding thereto. The channel layer 141 may be formed of a semiconductor material that can be used as channel regions of the memory cell strings. In an embodiment, the channel layer 141 may contain silicon (Si), germanium (Ge) or a mixture thereof. The core insulating layer 143 and the capping layer 145 may be aligned in the third direction DR3. The channel layer 141 may extend along the side of the core insulating layer 143 and the side of the capping layer 145. The channel layer 141 may extend to be interposed between the core insulating layer 143 and the doped semiconductor layer 101. The capping layer 145 may be formed of a doped semiconductor layer including at least one of an n-type impurity and a p-type impurity. In an embodiment, the capping layer 145 may be formed of n-type doped silicon including the n-type impurity as a majority carrier. Although not illustrated in the drawing, the capping layer 145 may be coupled to the bit line BL corresponding thereto via a conductive bit line contact (not illustrated). The conductive bit line contact (not illustrated) and the corresponding bit line BL may be used as an interconnection for electrically connecting the peripheral circuit structure PS, illustrated in FIG. 1A or 1B, to each memory cell string.

The channel layer 141 may be controlled by the conductive layers 113, 123A, and 123B of a multi-stacked body used as gate electrodes. The conductive layers 113, 123A, and 123B of the multi-stacked body may extend in the first direction DR1 and the second direction DR2. Each of the conductive layers 113, 123A, and 123B of the multi-stacked body may include at least one of a doped semiconductor layer and a metal layer. The doped semiconductor layer may include a doped silicon layer. The metal layer may contain tungsten, copper, molybdenum, or the like. Each of the conductive layers 113, 123A, and 123B of the multi-stacked body may further include a conductive metal nitride layer. The conductive metal nitride layer may contain a titanium nitride, a tantalum nitride, etc.

At least one conductive layer adjacent to the doped semiconductor layer 101, among the conductive layers 113, 123A, and 123B of the multi-stacked body, may be used as the source select line SSL illustrated in FIG. 2. At least one conductive layer adjacent to the bit line 151, among the conductive layers 113, 123A, and 123B of the multi-stacked body, may be used as the drain select line DSL. The remaining conductive layers, other than the conductive layer used as the source select line and the conductive layer used as the drain select line, among the conductive layers 113, 123A, and 123B of the multi-stacked body, may be used as the plurality of word lines WL illustrated in FIG. 2.

The multi-stacked body may include gate stacked bodies of two or more layers. In an embodiment, the multi-stacked body may include a first type-gate stacked body 110 and at least one second type-gate stacked body overlapping the first type-gate stacked body 110. Although FIGS. 3A and 3B illustrate an embodiment in which double layer second type-gate stacked bodies 120A and 120B overlap the first type-gate stacked body 110, an embodiment of the present disclosure is not limited thereto. The double layer second type-gate stacked bodies 120A and 120B may include a first-layer second type-gate stacked body 120A and a second-layer second type-gate stacked body 120B. The first-layer second type-gate stacked body 120A may be disposed between the second-layer second type-gate stacked body 120B and the first type-gate stacked body 110.

The conductive layers 113, 123A, and 123B of the multi-stacked body may include a plurality of conductive layers 113 of the first type-gate stacked body 110, a plurality of conductive layers 123A of the first-layer second type-gate stacked body 120A, and a plurality of conductive layers 123B of the second-layer second type-gate stacked body 120B.

The plurality of conductive layers 113 included in the first type-gate stacked body 110 may be disposed to be spaced apart from each other in the third direction DR3. The first type-gate stacked body 110 may further include a plurality of interlayer insulating layers 111 disposed to alternate with the plurality of conductive layers 113 in the third direction DR3. The plurality of interlayer insulating layers 111 may extend in the first direction DR1 and the second direction DR2, and may include a silicon oxide layer or the like.

Referring to FIG. 3A, the first type-gate stacked body 110 may be spaced apart from the doped semiconductor layer 101. In an embodiment, a lower insulating layer 103 may be disposed between the first type-gate stacked body 110 and the doped semiconductor layer 101.

Referring to FIG. 3B, the first type-gate stacked body 110 may include a surface contacting the doped semiconductor layer 101. In an embodiment, one interlayer insulating layer 111 adjacent to the doped semiconductor layer 101, among the plurality of interlayer insulating layers 111 of the first type-gate stacked body 110, may contact the doped semiconductor layer 101.

Referring to FIGS. 3A and 3B, the semiconductor memory device may include a plurality of first type-gate stacked bodies 110 arranged at the same level. First separation structures 119 may be disposed between the first type-gate stacked bodies 110 neighboring each other.

The plurality of conductive layers 123A included in the first-layer second type-gate stacked body 120A may be spaced apart from each other in the third direction DR3. The first-layer second type-gate stacked body 120A may further include a plurality of interlayer insulating layers 121A disposed to alternate with the plurality of conductive layers 123A in the third direction DR3. The plurality of interlayer insulating layers 121A may extend in the first direction DR1 and the second direction DR2, and may include a silicon oxide layer or the like.

The semiconductor memory device may include a plurality of first-layer second type-gate stacked bodies 120A arranged at the same level. Second separation structures 129A may be disposed between the first-layer second type-gate stacked bodies 120A neighboring each other.

The plurality of conductive layers 123B included in the second-layer second type-gate stacked body 120B may be spaced apart from each other in the third direction DR3. The second-layer second type-gate stacked body 120B may further include a plurality of interlayer insulating layers 121B disposed to alternate with the plurality of conductive layers 123B in the third direction DR3. The plurality of interlayer insulating layers 121B may extend in the first direction DR1 and the second direction DR2, and may include a silicon oxide layer or the like.

The semiconductor memory device may include a plurality of second-layer second type-gate stacked bodies 120B arranged at the same level. Third separation structures 129B may be disposed between the second-layer second type-gate stacked bodies 120B neighboring each other.

Each of the first separation structures 119, the second separation structures 129A, and the third separation structures 129B may be formed in a trench type, a hole type, or a combination thereof. A fill material (filler) arranged in each of the first separation structures 119, the second separation structures 129A, and the third separation structures 129B may be designed in various manners. In an embodiment, the fill material may include an insulating layer. In an embodiment, the fill material may further include at least one of a conductive layer and a semiconductor layer in addition to the insulating layer.

Each of the first type-gate stacked body 110, the first-layer second type-gate stacked body 120A, and the second-layer second type-gate stacked body 120B may include a plurality of channel holes 115, 125A or 125B extending in the third direction DR3. The plurality of channel holes 115, 125A or 125B may correspond to the plurality of channel pillars 140, respectively. More specifically, each channel pillar 140 may include a first portion, a second portion extending from the first portion in the third direction DR3, and a third portion extending from the second portion in the third direction DR3. The first portion of each channel pillar 140 may be disposed in the channel hole 115 of the first type-gate stacked body 110. The second portion of each channel pillar 140 may be disposed in the channel hole 125A of the first-layer second type-gate stacked body 120A. The third portion of each channel pillar 140 may be disposed in the channel hole 125B of the second-layer second type-gate stacked body 120B.

A memory layer 117, 127A, or 127B may be disposed between each of the conductive layers 113, 123A, and 123B of the multi-stacked body and the channel pillar 140. In detail, the memory layer 117 may be disposed between the first portion of the channel pillar 140 and the first type-gate stacked body 110, and may extend along the inner wall of the channel hole 115. The memory layer 127A may be disposed between the second portion of the channel pillar 140 and the first-layer second type-gate stacked body 120A, and may extend along the inner wall of the channel hole 125A. An end of the memory layer 127A may extend into the channel hole 115 of the first type-gate stacked body 110. The end of the memory layer 127A may be arranged closer to the center of the channel hole 115 than the memory layer 117, and may be spaced apart from the memory layer 117. In other words, a portion of the memory layer 117 may be spaced apart from the center of the channel hole 115 with the end of the memory layer 127A interposed between the portion of the memory layer 117 and the center of the channel hole 115. The memory layer 127B may be disposed between the third portion of the channel pillar 140 and the second-layer second type-gate stacked body 120B, and may extend along the inner wall of the channel hole 125B. An end of the memory layer 127B may extend into the channel hole 125A of the first-layer second type-gate stacked body 120A. The end of the memory layer 127B may be arranged closer to the center of the channel hole 125A than the memory layer 127A, and may be spaced apart from the memory layer 127A. In other words, a portion of the memory layer 127A may be spaced apart from the center of the channel hole 125A with the end of the memory layer 127B interposed between the portion of the memory layer 127A and the center of the channel hole 125A.

The channel layer 141 may continuously extend along the inner wall of each of the memory layers 117, 127A, and 127B.

Figure 4:
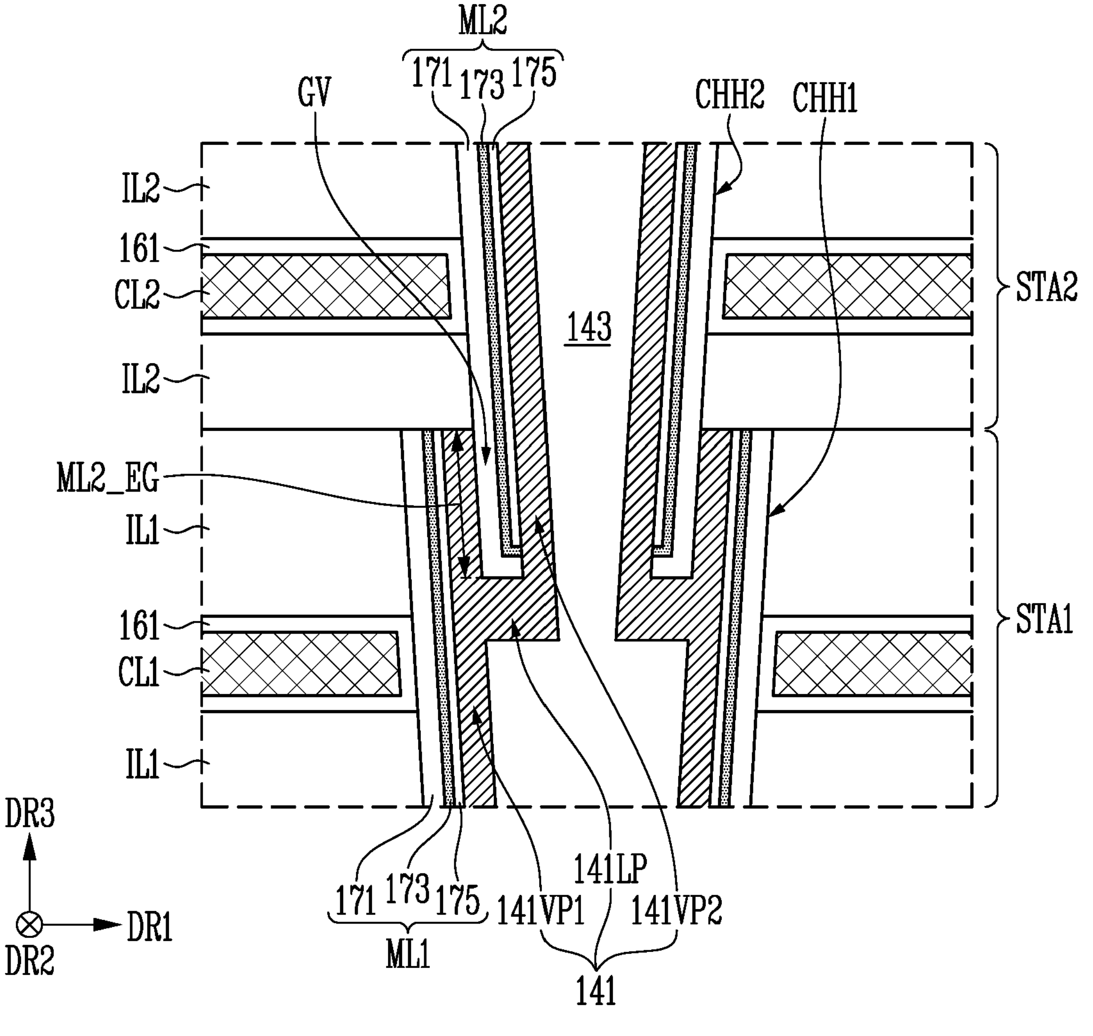
FIG. 4 is an enlarged sectional view of a portion of a semiconductor memory device adjacent to an interface between gate stacked bodies.

FIG. 4 is an enlarged sectional view of a portion of a semiconductor memory device adjacent to an interface between gate stacked bodies. In detail, FIG. 4 may be an enlarged sectional view of region "R1" illustrated in FIGS. 3A and 3B, and may be an enlarged sectional view of region "R2" illustrated in FIGS. 3A and 3B. The first direction DR1, the second direction DR2, and the third direction DR3, illustrated in FIG. 4, may be identical to those described in FIGS. 3A and 3B.

Referring to FIG. 4, the semiconductor memory device may include a first gate stacked body STA1 and a second gate stacked body STA2. The second gate stacked body STA2 may overlap the first gate stacked body STA1 in the third direction DR3. In an embodiment, the first gate stacked body STA1 and the second gate stacked body STA2 may correspond to the first type-gate stacked body 110 and the first-layer second type-gate stacked body 120A overlapping the first type-gate stacked body 110, respectively, which are illustrated in FIGS. 3A and 3B. In an embodiment, the first gate stacked body STA1 and the second gate stacked body STA2 may correspond to the first-layer second type-gate stacked body 120A and the second-layer second type-gate stacked body 120B overlapping the first-layer second type-gate stacked body 120A, respectively, which are illustrated in FIGS. 3A and 3B.

Conductive layers provided as gate electrodes for controlling the channel layer 141 may include a first conductive layer CL1 of the first gate stacked body STA1 and a second conductive layer CL2 of the second gate stacked body STA2. The first conductive layer CL1 may be arranged to alternate with a first interlayer insulating layer IL1 of the first gate stacked body STA1 in the third direction DR3, and the second conductive layer CL2 may be arranged to alternate with a second insulating layer IL2 of the second gate stacked body STA2 in the third direction DR3.

The first gate stacked body STA1 may include a first channel hole CHH1, and the second gate stacked body STA2 may include a second channel hole CHH2. The first channel hole CHH1 may be provided as a plurality of first channel holes and the second channel hole CHH2 may be provided as a plurality of second channel holes. The semiconductor memory device may include a first memory layer ML1 extending along the inner wall of the first channel hole CHH1 and a second memory layer ML2 extending along the inner wall of the second channel hole CHH2. The second memory layer ML2 may include an end ML2_EG protruding into the first channel hole CHH1. As described above with reference to FIGS. 3A and 3B, the end ML2_EG of the second memory layer ML2 may be arranged closer to the center of the first channel hole CHH1 than the first memory layer ML1, and may be spaced apart from the first memory layer ML1.

The width of the first channel hole CHH1 may become larger in a direction closer to the interface between the first gate stacked body STA1 and the second gate stacked body STA2. The width of the second channel hole CHH2 may become smaller in a direction closer to the interface between the first gate stacked body STA1 and the second gate stacked body STA2.

Each of the first memory layer ML1 and the second memory layer ML2 may include a first blocking insulating layer 171, a data storage layer 173 between the first blocking insulating layer 171 and the channel layer 141, and a tunnel insulating layer 175 between the data storage layer 173 and the channel layer 141. The first blocking insulating layer 171 may include an insulating material capable of blocking charges. The tunnel insulating layer 175 may include an insulating material enabling charge tunneling. The first blocking insulating layer 171 may include an insulating layer having a dielectric constant higher than that of the tunnel insulating layer 175. The data storage layer 173 may be formed of a material layer capable of storing data changed through Fowler-Nordheim tunneling. In an embodiment, the data storage layer 173 may be formed of a charge trap insulating layer or a floating gate layer, or may be formed of an insulating layer containing conductive nanodots. The charge trap insulating layer may include a silicon nitride layer. An embodiment of the present disclosure is not limited thereto, and the data storage layer 173 may be formed of a material layer that is capable of storing information based on an operating principle other than Fowler-Nordheim tunneling. In an embodiment, the data storage layer 173 may include a phase-change material layer, a ferroelectric layer, etc.

A second blocking insulating layer 161 may be interposed between each of the first conductive layer CL1 and the second conductive layer CL2 and the interlayer insulating layer IL1 or IL2 corresponding thereto. The second blocking insulating layer 161 may extend to an area between each of the first conductive layer CL1 and the second conductive layer CL2 and the memory layer ML1 or ML2 corresponding thereto. The second blocking insulating layer 161 may include a metal oxide such as an aluminum oxide.

The channel layer 141 may be formed in a structure into which a portion extending along the inner wall of the first memory layer ML1 and a portion extending along the inner wall of the second memory layer ML2 are integrated with each other. The channel layer 141 may include a groove GV into which the end ML2_EG of the second memory layer ML2 is inserted. In an embodiment, the channel layer 141 may include a first vertical portion 141VP1, a second vertical portion 141VP2, and a connection portion 141LP. The first vertical portion 141VP1 may be interposed between the first memory layer ML1 and the end ML2_EG of the second memory layer ML2, and may extend along the inner wall of the first memory layer ML1. The second vertical portion 141VP2 may extend along the inner wall of the second memory layer ML2. The connection portion 141LP may be formed along the bottom surface of the second memory layer ML2, and may extend from the first vertical portion 141VP1 towards the second vertical portion 141VP2. The first vertical portion 141VP1, the second vertical portion 141VP2, and the connection portion 141LP may be formed in an integrated structure without having an interface.

Figure 5:
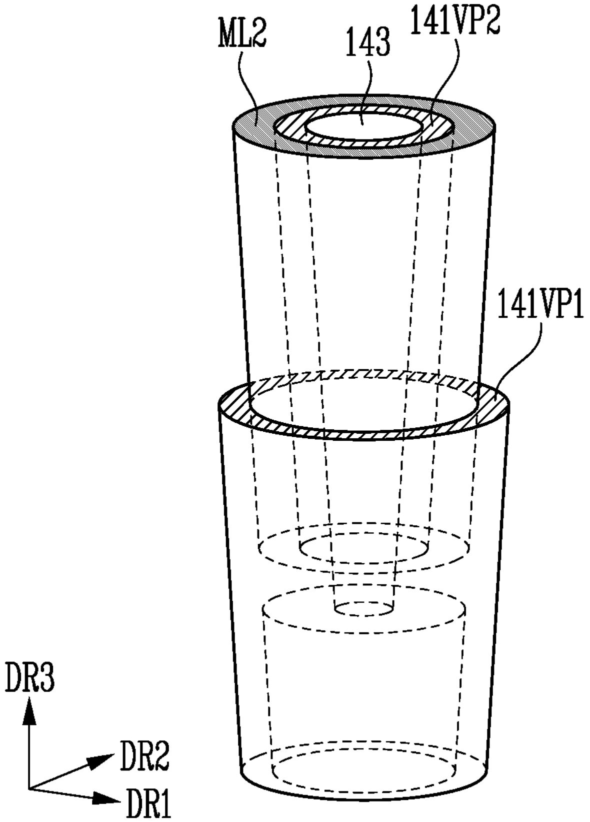
FIG. 5 is a perspective view of a channel layer illustrated in FIG. 4.

FIG. 5 is a perspective view of a channel layer illustrated in FIG. 4.

Referring to FIGS. 4 and 5, the first vertical portion 141VP1 and the second vertical portion 141VP2 of the channel layer 141 may extend along the side of a core insulating layer 143. In an embodiment, the first vertical portion 141VP1 and the second vertical portion 141VP2 may enclose the side of the core insulating layer 143 in a ring shape.

The core insulating layer 143 may include a protrusion that protrudes sideways. The protrusion of the core insulating layer 143 may extend along the connection portion 141LP of the channel layer 141.

Figure 6:
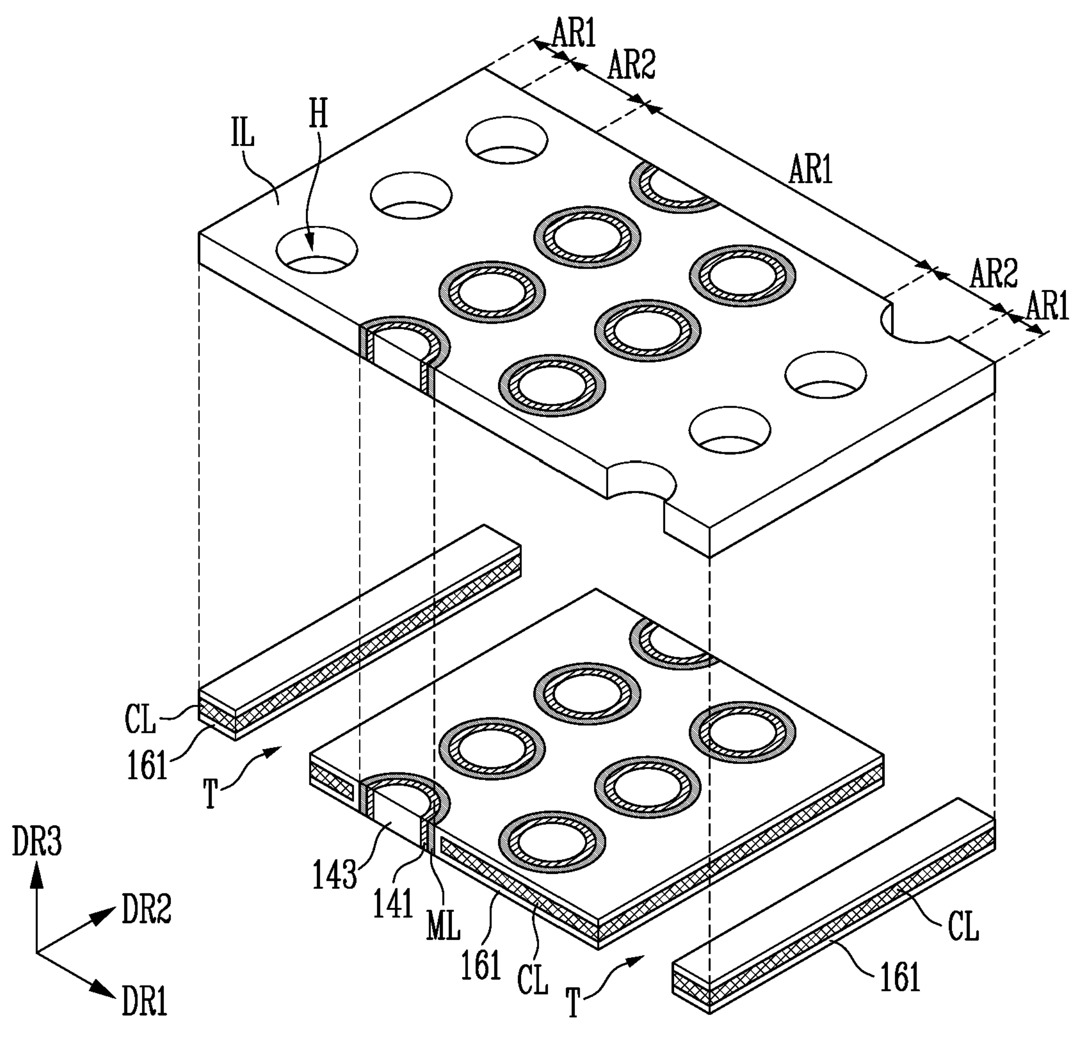
FIGS. 6 and 7 are exploded perspective views of a portion of a semiconductor memory device adjacent to a separation structure.
Figure 7:
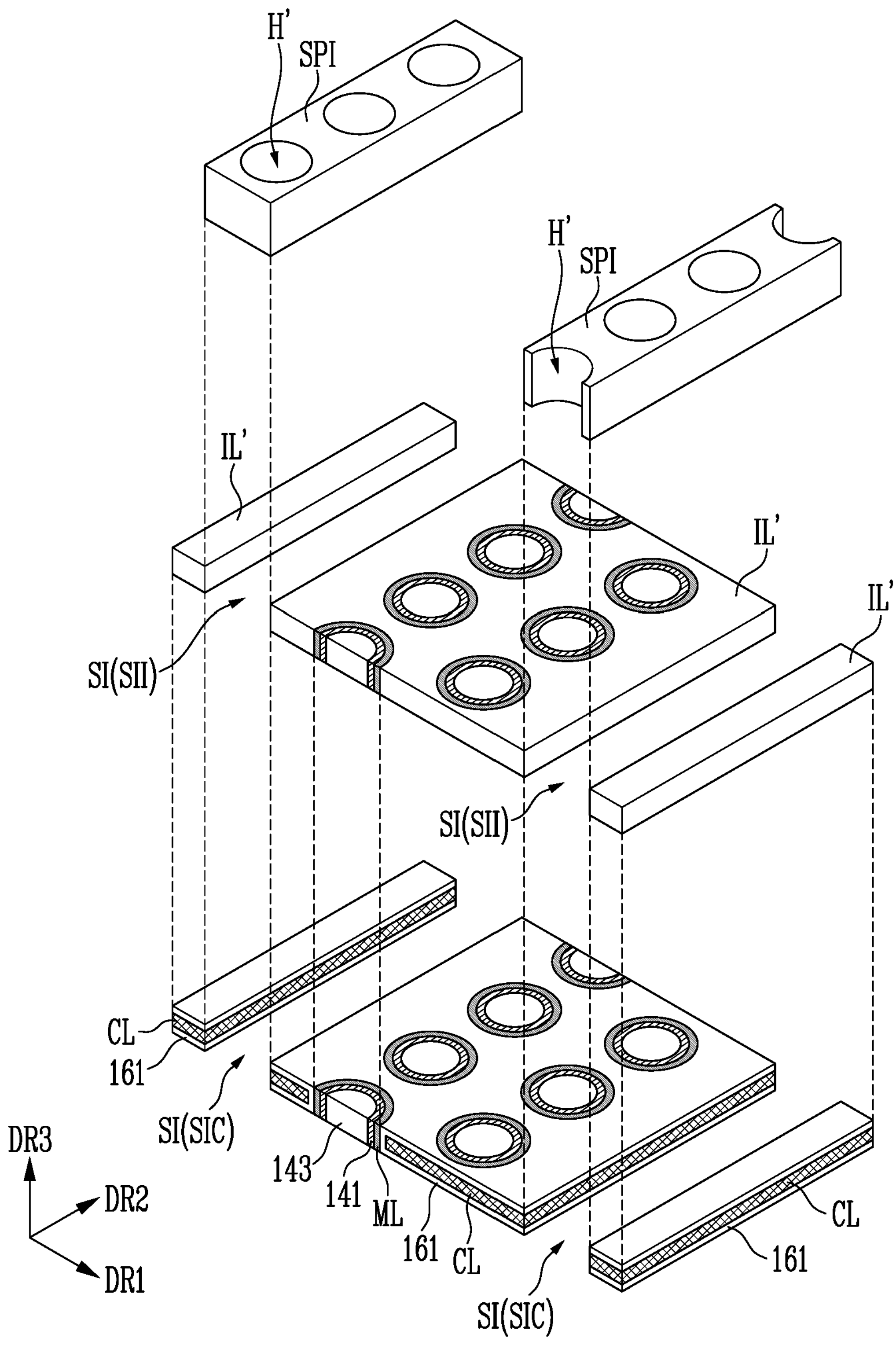

FIGS. 6 and 7 are exploded perspective views of a portion of a semiconductor memory device adjacent to a separation structure.

In detail, FIGS. 6 and 7 may be exploded perspective views of a portion of the semiconductor memory device adjacent to the first separation structure 119, the second separation structure 129A or the third separation structure 129B illustrated in FIGS. 3A and 3B. The first direction DR1, the second direction DR2, and the third direction DR3, illustrated in FIGS. 6 and 7, may be identical to those described in FIGS. 3A and 3B.

Referring to FIG. 6, the first separation structure 119, the second separation structure 129A or the third separation structure 129B illustrated in FIGS. 3A and 3B may be formed in a structure in which a trench T and a hole H are mixed.

The trench T is disposed between neighboring conductive layers CL at the same level, thus enabling the neighboring conductive layers CL to be structurally and electrically isolated from each other. A plurality of holes H may overlap each trench T. The plurality of holes H may pass through an interlayer insulating layer IL.

The interlayer insulating layer IL may include a first area AR1 overlapping each conductive layer CL and a second area AR2 extending from the first area AR1. The second area AR2 may protrude further in the first direction DR1 than the conductive layer CL. The second area AR2 may overlap the trench T. In other words, the second area AR2 might not overlap the conductive layer CL. The plurality of holes H may pass through the second area AR2 of the interlayer insulating layer IL, and may be arranged in a line along the extension direction (e.g., the second direction DR2) of the trench T. The second area AR2 of the interlayer insulating layer IL may function as a support in a process of manufacturing the semiconductor memory device.

Each conductive layer CL and the first area AR1 of the interlayer insulating layer IL, overlapping the conductive layer CL, may enclose the memory layer ML, the channel layer 141, and the core insulating layer 143 in a ring shape.

The second blocking insulating layer 161 may be cut by the trench and the side of each hole H might not be covered by the second blocking insulating layer 161, as illustrated in the drawings. Although not illustrated in the drawings, the second blocking insulating layer 161 may extend along the side of each hole H in an embodiment.

Referring to FIG. 7, the first separation structure 119, the second separation structure 129A or the third separation structure 129B illustrated in FIGS. 3A and 3B may be implemented as a trench-type slit SI.

The slit SI may include a first portion SIC and a second portion SII. The first portion SIC of the slit SI may be disposed between neighboring conductive layers CL at the same level, thus enabling the neighboring conductive layers CL to be structurally and electrically isolated from each other. The second portion SII of the slit SI may be disposed between neighboring interlayer insulating layers IL' at the same level, thus enabling the neighboring interlayer insulating layers IL' to be structurally separated from each other.

The semiconductor memory device may further include a support insulating layer SPI disposed in the slit SI. The support insulating layer SPI may be a portion of a fill material disposed in the first separation structure 119, the second separation structure 129A or the third separation structure 129B illustrated in FIGS. 3A and 3B.

The support insulating layer SPI may extend along the first portion SIC of the slit SI to cover the side of each conductive layer CL. The support insulating layer SPI may extend along the second portion SII of the slit SI to cover the side of each interlayer insulating layer IL'.

The support insulating layer SPI may be passed through by a plurality of auxiliary holes H'. The plurality of auxiliary holes H' may be arranged in a line along the slit SI. The support insulating layer SPI may function as a support in the process of manufacturing the semiconductor memory device.

The conductive layer CL and the interlayer insulating layer IL' may enclose the memory layer ML, the channel layer 141, and the core insulating layer 143 in a ring shape.

The second blocking insulating layer 161 may be cut to open the side of the interlayer insulating layer IL', as illustrated in the drawing. Although not illustrated in the drawing, the second blocking insulating layer 161 may extend along the side of the second portion SII of the slit SI in an embodiment.

Figure 8:
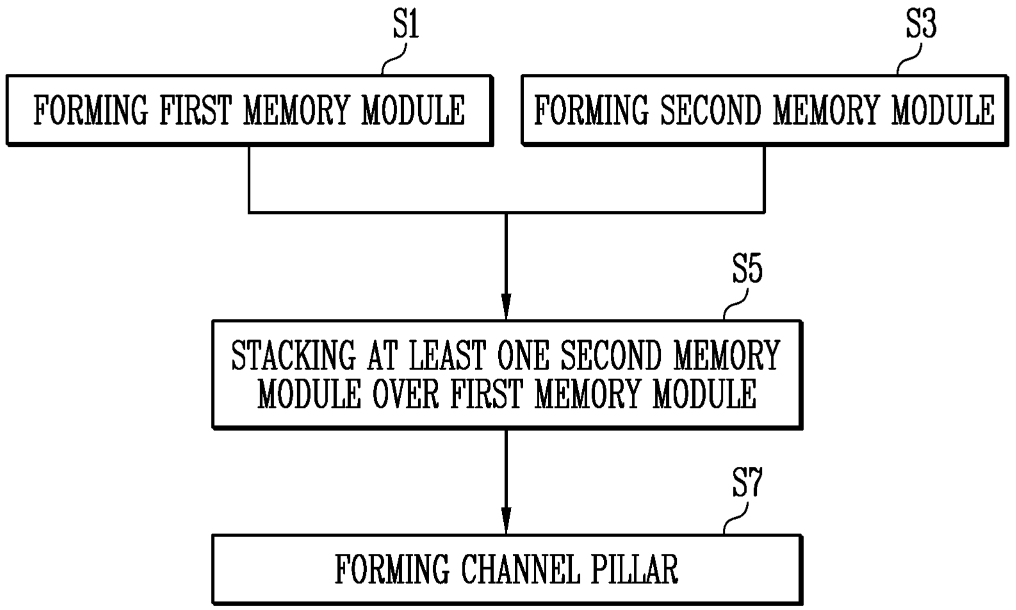
FIG. 8 is a flowchart illustrating a method of manufacturing a semiconductor memory device according to an embodiment of the present disclosure.

FIG. 8 is a flowchart illustrating a method of manufacturing a semiconductor memory device according to an embodiment of the present disclosure.

Referring to FIG. 8, the method of manufacturing the semiconductor memory device may include step S1 of forming a first memory module, step S3 of forming a second memory module, step S5 of stacking at least one second memory module over the first memory module, and step S7 of forming a channel pillar.

The first memory module provided at step "S1" may be associated with the first type-gate stacked body 110 illustrated in FIGS. 3A and 3B. The second memory module provided at step "S3" may be associated with the second type-gate stacked body 120A or 120B illustrated in FIGS. 3A and 3B.

As the number of stacks of the second memory module stacked at step "S5" increases, the capacity and integration degree of the semiconductor memory device may increase. According to an embodiment of the present disclosure, the number of stacks of gate stacked bodies of the semiconductor memory device may be increased by increasing the number of stacks of second memory modules formed using a manufacturing method consistent with a modular scheme. Therefore, even though the number of stacks of conductive layers of the gate stacked body formed through a single process is not increased, in an embodiment, the capacity and integration degree of the semiconductor memory device may be improved, and thus process burden attributable to the increased height of the gate stacked body may be reduced.

The channel pillar provided at step "S7" may be combined with the first memory module and the second memory module. Step "S7" may be followed by various subsequent processes such as forming bit lines.

FIGS. 9A, 9B, 9C, 9D, 9E, and 9F are sectional views illustrating embodiments of step "S1" illustrated in FIG. 8.

Figure 9A:
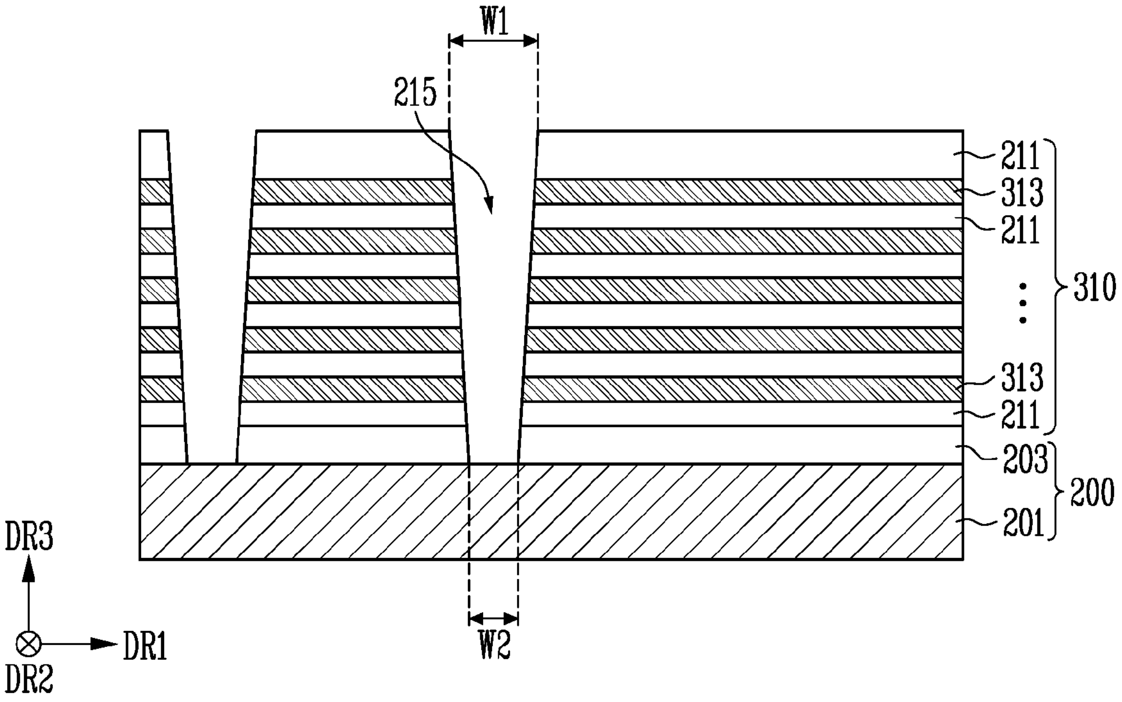
FIGS. 9A, 9B, 9C, 9D, 9E, and 9F are sectional views illustrating embodiments of step "S1" illustrated in FIG. 8.

Referring to FIG. 9A, step "S1" may include the step of forming a lower structure 200 and the step of forming a first stacked body 310 over the lower structure 200.

The lower structure 200 may include a semiconductor layer 201 and a lower insulating layer 203 over the semiconductor layer 201. The semiconductor layer 201 may extend in a first direction DR1 and a second direction DR2 intersecting each other on an XY plane. The semiconductor layer 201 may be a sacrificial substrate formed of a silicon wafer or the like, or may be a doped semiconductor layer formed over a second structure ST2 including the peripheral circuit structure PS, described above with reference to FIG. 1A. The doped semiconductor layer may include at least one of an n-type impurity and a p-type impurity. The lower insulating layer 203 may be formed of various insulating materials such as a silicon oxide layer or an aluminum oxide layer.

A plurality of first interlayer insulating layers 211 and a plurality of first sacrificial layers 313 may be alternately stacked in the third direction DR3 over the lower insulating layer 203. Thereby, the first stacked body 310 may be formed. The third direction DR3 may be a Z-axis direction intersecting the XY plane. Among the plurality of first interlayer insulating layers 211 of the first stacked body 310, the uppermost first interlayer insulating layer and the lowermost first interlayer insulating layer may be respectively arranged in the uppermost portion and the lowermost portion of the first stacked body 310.

The plurality of first sacrificial layers 313 may be made of a material having an etch selectivity with respect to the plurality of first interlayer insulating layers 211. In an embodiment, each first interlayer insulating layer 211 may include an insulating material such as a silicon oxide layer and a silicon oxynitride layer, and each first sacrificial layer 313 may include a sacrificial insulating material such as a silicon nitride layer.

Step "S1" may include the step of forming a first channel hole 215. The first channel hole 215 may pass through the plurality of first interlayer insulating layers 211 and the plurality of first sacrificial layers 313. The first channel hole 215 may extend to pass through the lower insulating layer 203. In this way, the semiconductor layer 201 may be exposed by the first channel hole 215. The first channel hole 215 may be provided as a plurality of first channel holes. The plurality of first channel holes 215 may be arranged in a plurality of columns and a plurality of rows. Each column may include the first channel holes 215 arranged in a line in the first direction DR1, and each row may include the first channel holes 215 arranged in a line in the second direction DR2.

During an etching process for forming the first channel hole 215, a slope may be defined on the sidewall of the first channel hole 215. Due to the slope of the sidewall of the first channel hole 215, the width of the first channel hole 215 may become smaller in a direction closer to the semiconductor layer 201. As a result, the first width W1 of the top of the first channel hole 215 may be formed to be greater than the second width W2 of the bottom of the first channel hole 215.

Figure 9B:
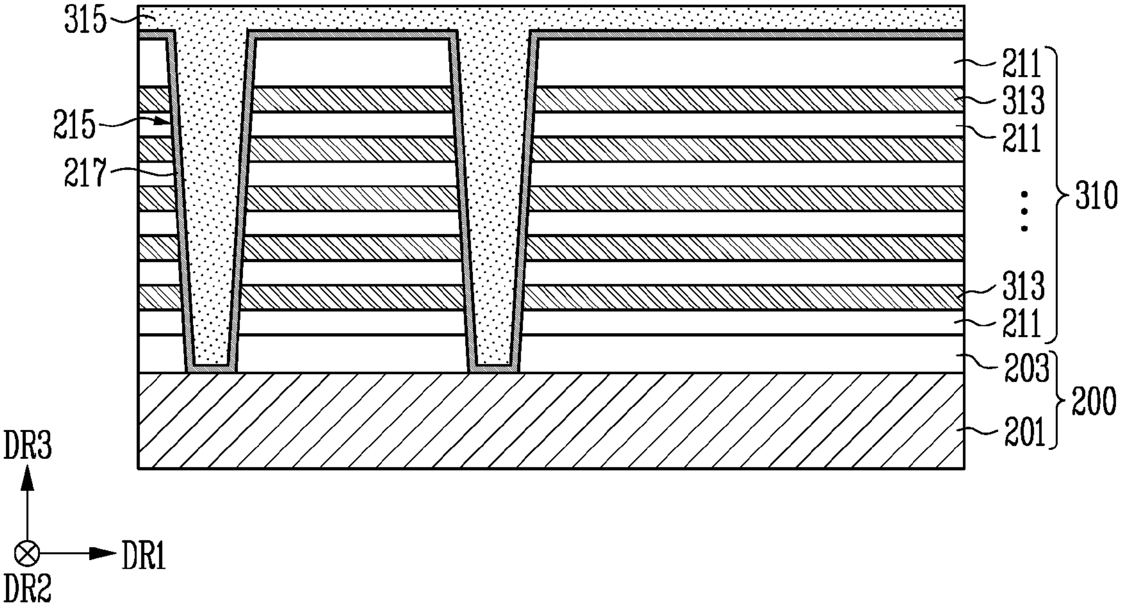

Referring to FIG. 9B, step "S1" may include the step of forming a first memory layer 217 and a filler layer 315 in the first channel hole 215.

The first memory layer 217 may extend along the surface of the first channel hole 215. The first memory layer 217 may include the first blocking insulating layer 171, the data storage layer 173, and the tunnel insulating layer 175, described above with reference to FIG. 4.

The filler layer 315 may be formed to fill a central region of the first channel hole 215 opened by the first memory layer 217. In an embodiment, the filler layer 315 may include tungsten.

Figure 9C:
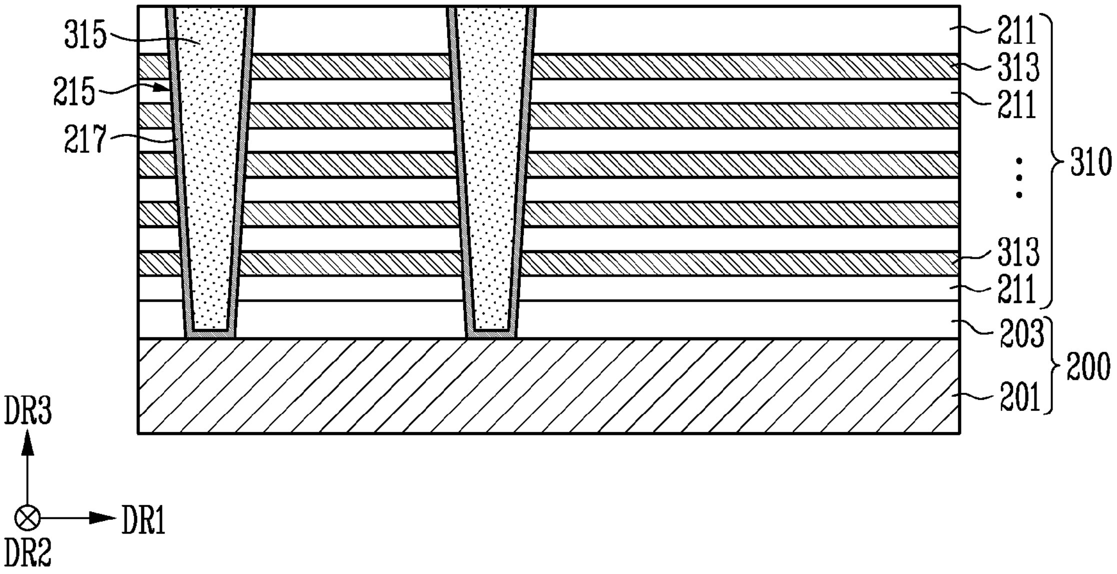

Referring to FIG. 9C, respective portions of the first memory layer 217 and the filler layer 315, disposed outside the first channel hole 215, may be removed through a planarization process.

Figure 9D:
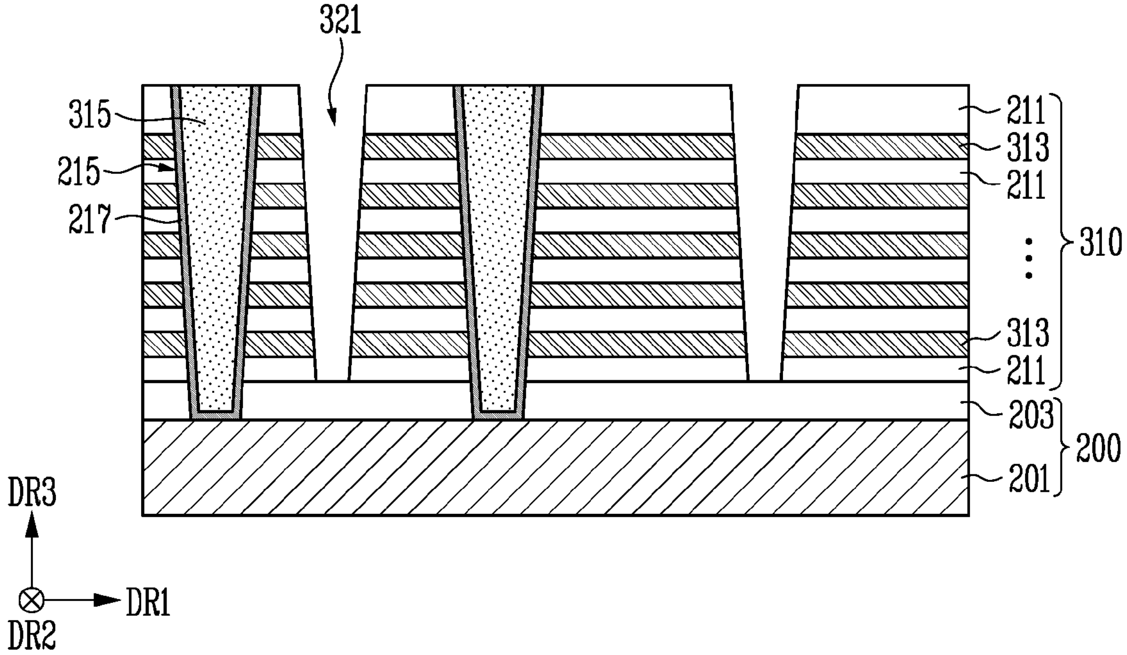

Referring to FIG. 9D, step "S1" may include the step of forming a first opening 321. The first opening 321 may pass through the plurality of first interlayer insulating layers 211 and the plurality of first sacrificial layers 313. The depth of the first opening 321 may be changed depending on the properties of the lower insulating layer 203, but the lower insulating layer 203 may remain to define the bottom surface of the first opening 321. The first opening 321 may be formed in a trench type or a hole type. When the first opening 321 is formed in the trench type, the first opening 321 may extend in the second direction DR2 and the first stacked body 310 may be separated into structures by the first opening 321. Each structure may include the first channel holes 215 in one or more rows. When the first opening 321 is formed in the hole type, the first opening 321 may be provided as a plurality of first openings which are arranged in a line in the second direction DR2. The first opening 321 formed in the hole type may be surrounded by the first stacked body 310.

Figure 9E:
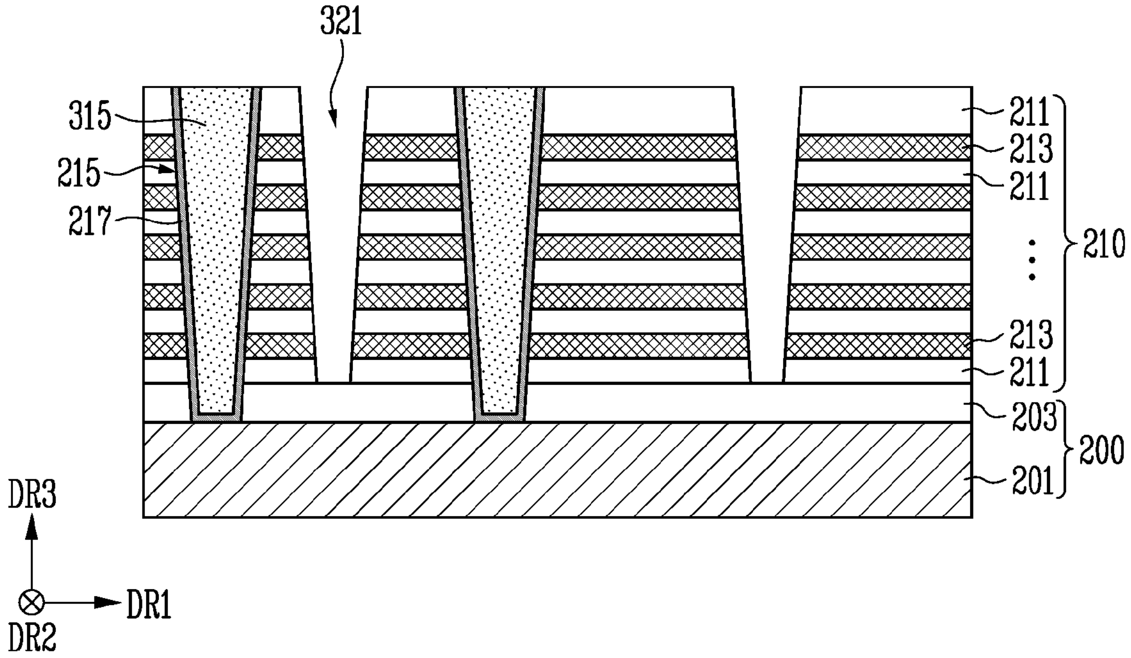

Referring to FIG. 9E, step "S1" may include the step of defining a first gate stacked body 210 by replacing the plurality of first sacrificial layers 313 illustrated in FIG. 9D with a plurality of first conductive layers 213.

The plurality of first sacrificial layers 313 illustrated in FIG. 9D may be selectively removed through the first opening 321. As the plurality of first sacrificial layers 313 illustrated in FIG. 9D are removed, a horizontal space between the first interlayer insulating layers 211 neighboring in the third direction DR3 may be opened. The step of forming the plurality of first conductive layers 213 may include the step of forming a conductive material to fill the horizontal space and the step of removing a portion of the conductive material through the first opening 321 so that the conductive material is separated into the plurality of first conductive layers 213. Although not illustrated in the drawing, a second blocking insulating layer 161 described above with reference to FIG. 4 may be formed in the horizontal space before the conductive material is formed.

The first gate stacked body 210, provided through the above-described processes, may include the plurality of first interlayer insulating layers 211 and the plurality of first conductive layers 213 that are alternately disposed over the lower structure 200. The first channel hole 215 may pass through the plurality of first interlayer insulating layers 211 and the plurality of first conductive layers 213 and may extend into the lower structure 200.

Figure 9F:
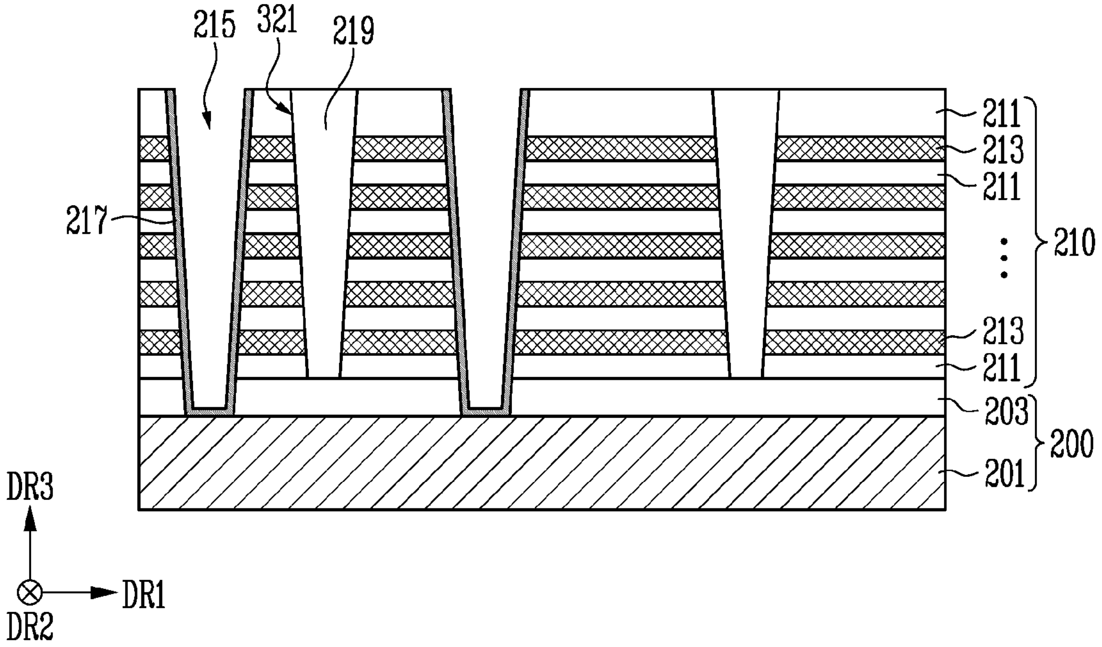

Referring to FIG. 9F, step "S1" may further include the step of forming a first vertical structure 219 to fill the first opening 321.

In an embodiment, the step of forming the first vertical structure 219 may include the step of forming an insulating layer to fill the first opening 321 and the step of performing a planarization process to remove a portion of the insulating layer disposed outside the first opening 321. Although not illustrated in the drawing, the first vertical structure 219 may further include at least one of a conductive layer, made of metal, and a semiconductor layer, in addition to the insulating layer, in an embodiment.

The planarization process, described above with reference to FIG. 9C, may be skipped. In this case, through the planarization process described with reference to FIG. 9F, respective portions of the first memory layer 217 and the filler layer 315, which are disposed outside the first channel hole 215 illustrated in FIG. 9B, may be removed.

After the first vertical structure 219 is formed, the filler layer 315 illustrated in FIG. 9E may be selectively removed. In this way, the central region of the first channel hole 215 may be opened, and the first memory layer 217 may be exposed.

Separately from step S1 described above with reference to FIGS. 9A to 9F, step "S3" illustrated in FIG. 8 may be performed. Step "S3" may include a cell array structure formation process and a sacrificial substrate separation process.

Figure 10A:
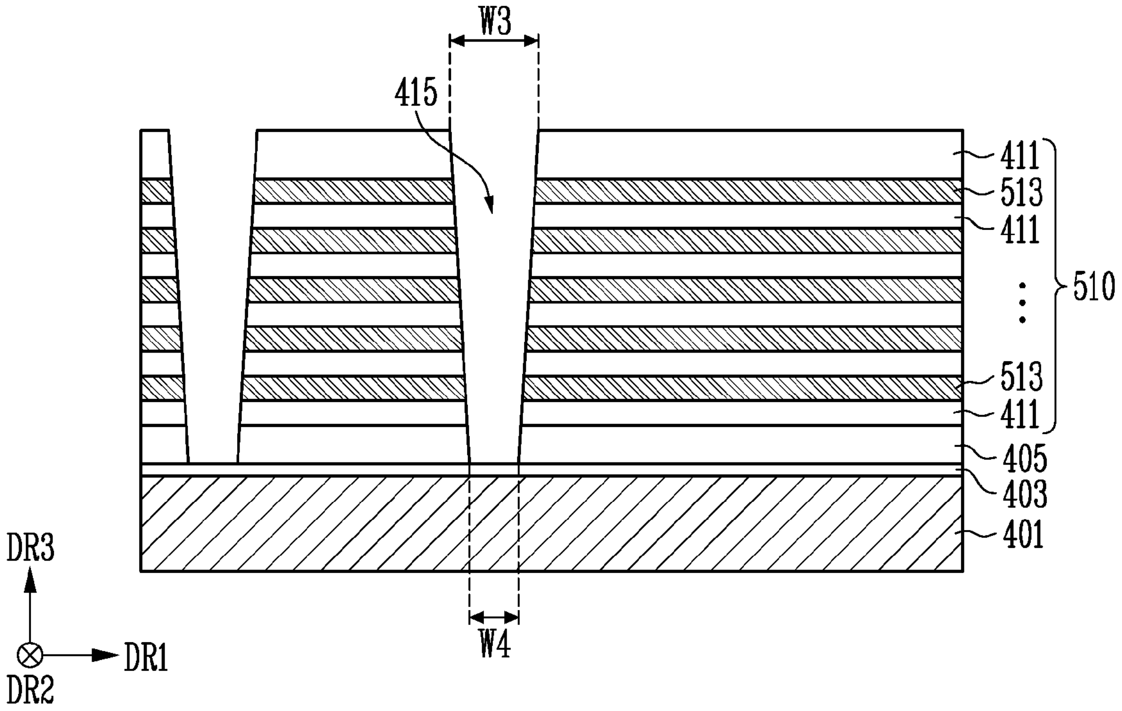
FIGS. 10A, 10B, and 10C are sectional views illustrating an embodiment of a cell array structure formation process at step "S3" illustrated in FIG. 8.
Figure 10B:
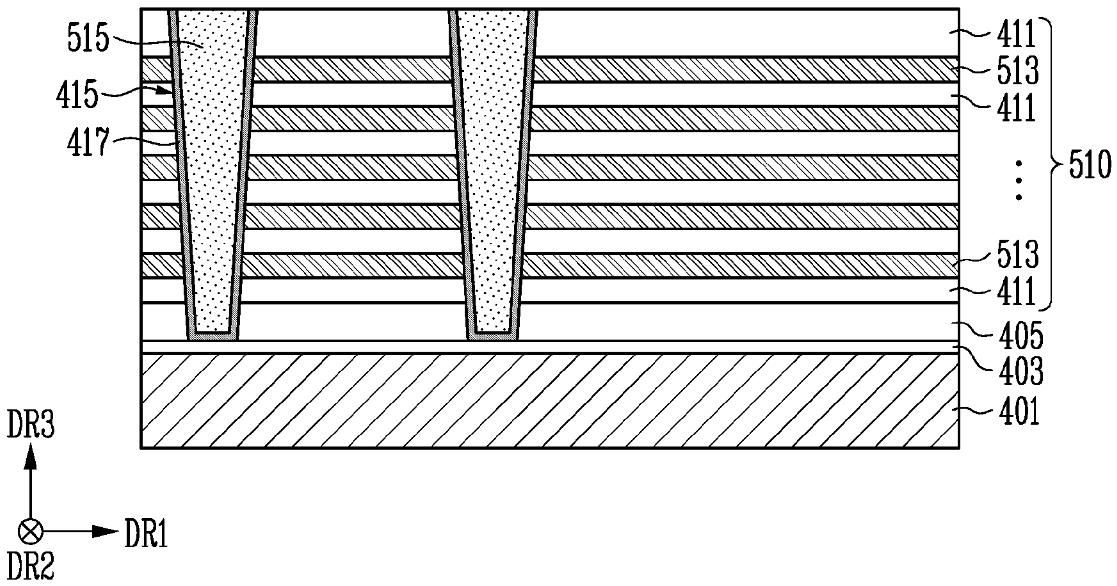
Figure 10C:
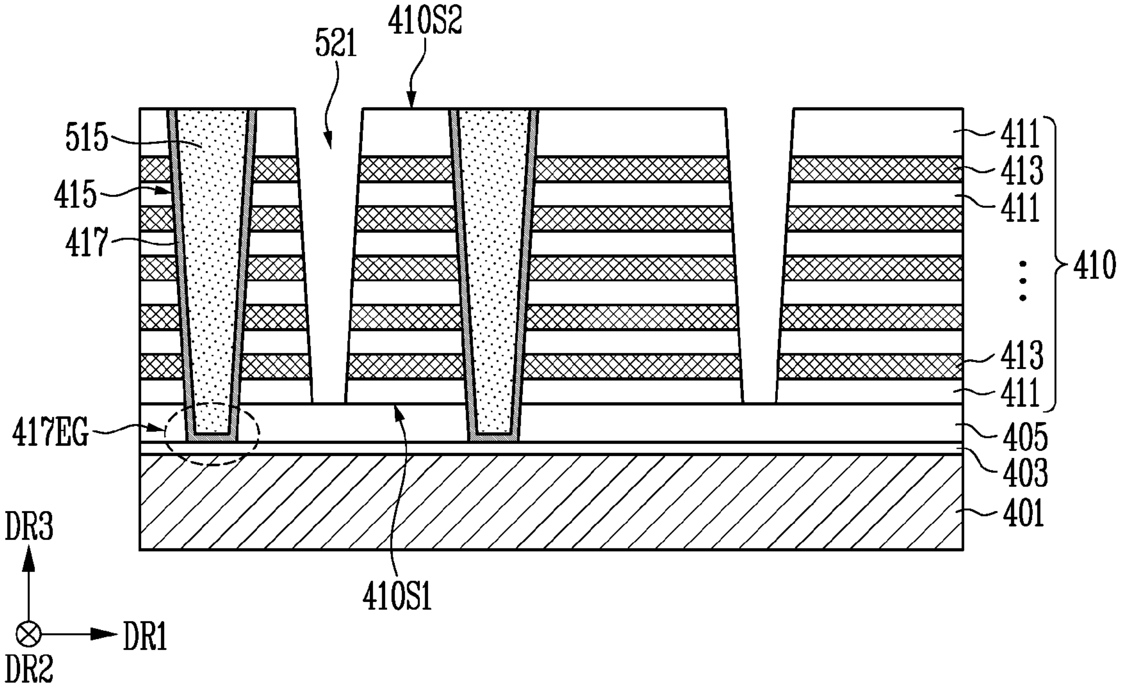

FIGS. 10A, 10B, and 10C are sectional views illustrating an embodiment of a cell array structure formation process at step "S3" illustrated in FIG. 8.

Referring to FIG. 10A, the cell array structure formation process may include the step of forming an interface layer 403 over a sacrificial substrate 401, the step of forming a spacer layer 405 over the interface layer 403, and the step of forming a second stacked body 510 over the spacer layer 405.

The sacrificial substrate 401 may extend in a first direction DR1 and a second direction DR2 intersecting each other on an XY plane. The sacrificial substrate 401 may include a silicon wafer or the like.

The interface layer 403 may include at least one of a silicon oxide layer and a silicon nitride layer. The interface layer 403 may be formed by the natural oxidation of the sacrificial substrate 401 or may be formed by depositing at least one of the silicon oxide layer and the silicon nitride layer over the sacrificial substrate 401.

The spacer layer 405 may be made of a material selected in consideration of an etch selectivity with respect to the interface layer 403 and material layers forming the second stacked body 510. In an embodiment, the spacer layer 405 may include a metal oxide layer such as an aluminum oxide layer.

A plurality of second interlayer insulating layers 411 and a plurality of second sacrificial layers 513 may be alternately stacked over the spacer layer 405 in the third direction DR3. In this way, the second stacked body 510 may be formed. The third direction DR3 may be a Z-axis direction intersecting the XY plane. Among the plurality of second interlayer insulating layers 411 of the second stacked body 510, the uppermost second interlayer insulating layer and the lowermost second interlayer insulating layer may be respectively arranged in the uppermost portion and the lowermost portion of the second stacked body 510.

The plurality of second sacrificial layers 513 may be made of a material having an etch selectivity with respect to the plurality of second interlayer insulating layers 411. In an embodiment, each second interlayer insulating layer 411 may include an insulating material such as a silicon oxide layer and a silicon oxynitride layer, and each second sacrificial layer 513 may include a sacrificial insulating material such as a silicon nitride layer.

The cell array structure formation process may include the step of forming a second channel hole 415. The second channel hole 415 may pass through the plurality of second interlayer insulating layers 411 and the plurality of second sacrificial layers 513. The second channel hole 415 may extend into the spacer layer 405. The depth of the second channel hole 415 may be varied by controlling the properties of the spacer layer 405, the etching amount of the spacer layer 405, or the like. In an embodiment, the depth of the second channel hole 415 may be controlled such that the second channel hole 415 passes through the bottom surface of the spacer layer 405 to expose the interface layer 403. The second channel hole 415 may be provided as a plurality of second channel holes. The plurality of second channel holes 415 may be arranged in a plurality of columns and a plurality of rows. Each column may include the second channel holes 415 arranged in a line in the first direction DR1, and each row may include the second channel holes 415 arranged in a line in the second direction DR2.

During an etching process for forming the second channel hole 415, a slope may be defined on the sidewall of the second channel hole 415. Due to the slope of the sidewall of the second channel hole 415, the width of the second channel hole 415 may become smaller in a direction closer to the sacrificial substrate 401. As a result, the third width W3 of the top of the second channel hole 415 may be formed to be greater than the fourth width W4 of the bottom of the second channel hole 415.

Referring to FIG. 10B, the cell array structure formation process may include the step of forming a second memory layer 417 and a sacrificial pillar 515 in the second channel hole 415.

The second memory layer 417 may extend along the surface of the second channel hole 415. The second memory layer 417 may include the first blocking insulating layer 171, the data storage layer 173, and the tunnel insulating layer 175, described above with reference to FIG. 4.

The sacrificial pillar 515 may be formed to fill a central region of the second channel hole 415 opened by the second memory layer 417. In an embodiment, the sacrificial pillar 515 may include tungsten.

Referring to FIG. 10C, the cell array structure formation process may include the step of forming a second opening 521. The second opening 521 may pass through the plurality of second interlayer insulating layers 411 and the plurality of second sacrificial layers 513, which are illustrated in FIG. 10B. The depth of the second opening 521 may be changed depending on the properties of the spacer layer 405, but the spacer layer 405 may remain to define the bottom surface of the second opening 521. The second opening 521 may be formed in a trench type or a hole type. When the second opening 521 is formed in the trench type, the second opening 521 may extend in the second direction DR2 and the second stacked body 510 shown in FIG. 10B may be separated into structures by the second opening 521. Each structure may include the second channel holes 415 in one or more rows. When the second opening 521 is formed in the hole type, the second opening 521 may be provided as a plurality of second openings which are arranged in a line in the second direction DR2. The second opening 521 formed in the hole type may be surrounded by the second stacked body 510.

The cell array structure formation process may include the step of defining a second gate stacked body 410 by replacing the plurality of second sacrificial layers 513, illustrated in FIG. 10C, with a plurality of second conductive layers 413. A process of forming the plurality of second conductive layers 413 of the second gate stacked body 410 may be same as the process of forming the plurality of first conductive layers 213 of the first gate stacked body 210, described above with reference to FIG. 9E.

The second gate stacked body 410, provided through the above-described processes, may include a first surface 410S1 and a second surface 410S2 facing opposite directions. The first surface 410S1 may face the sacrificial substrate 401, and the second surface 410S2 may face the third direction DR3. The second channel hole 415 included in the second gate stacked body 410 may pass through the plurality of second interlayer insulating layers 411 and the plurality of second conductive layers 413. The second channel hole 415 may include an end 417EG extending into the spacer layer 405. The end 417EG of the second memory layer 417 may protrude beyond the first surface 410S1 of the second gate stacked body 410 to be disposed in the end of the second channel hole 415.

The sacrificial substrate separation process included in step "S3" illustrated in FIG. 8 may be changed depending on the shape of the second opening 521.

Figure 11A:
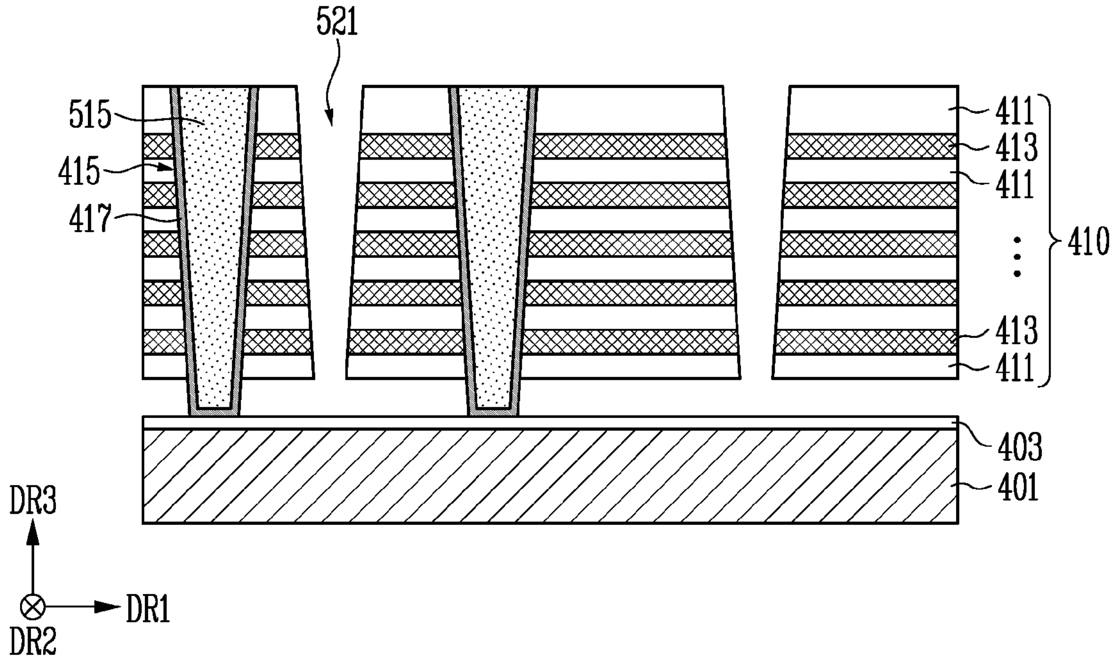
FIGS. 11A and 11B are sectional views illustrating an embodiment of a sacrificial substrate separation process at step "S3" illustrated in FIG. 8.
Figure 11B:
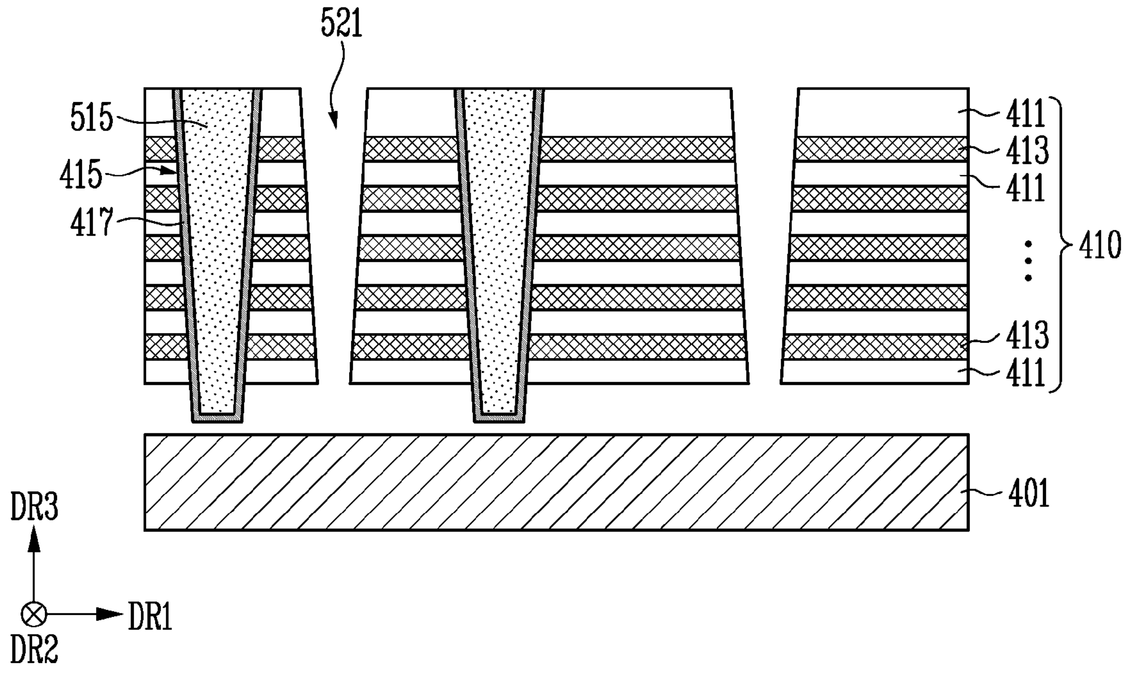

FIGS. 11A and 11B are sectional views illustrating an embodiment of a sacrificial substrate separation process at step "S3" illustrated in FIG. 8. More specifically, FIGS. 11A and 11B illustrate a sacrificial substrate separation process using the second opening 521 formed in a hole type.

Referring to FIG. 11A, the spacer layer 405, illustrated in FIG. 10C, may be selectively removed through the second opening 521 so that the interface layer 403 is exposed.

In accordance with the embodiment in which the second opening 521 is formed in a hole type, each of the plurality of interlayer insulating layers 411 may include a first area AR1 and a second area AR2, as in the case of the interlayer insulating layer IL, illustrated in FIG. 6. After the plurality of second conductive layers 413 are formed, the second opening 521 may maintain a hole-type structure enclosed by the second areas of the second interlayer insulating layers 411 at the level at which the second interlayer insulating layers 411 are disposed. Accordingly, in an embodiment, the deformation of the second gate stacked body 410 may be reduced or prevented by the second areas of the second interlayer insulating layers 411.

Referring to FIG. 11B, the interface layer 403 illustrated in FIG. 11A may be selectively removed. In this way, the sacrificial substrate 401 may be separated from the second gate stacked body 410. In an embodiment, the deformation of the second gate stacked body 410 may be reduced or prevented by the second areas of the second interlayer insulating layers 411, described with reference to FIG. 11A.

FIGS. 12A, 12B, 12C, and 12D are sectional views illustrating an embodiment of the sacrificial substrate separation process at step "S3" illustrated in FIG. 8. More specifically, FIGS. 12A, 12B, 12C, and 12D illustrate a sacrificial substrate separation process using the second opening 521 formed in a trench type.

Figure 12A:
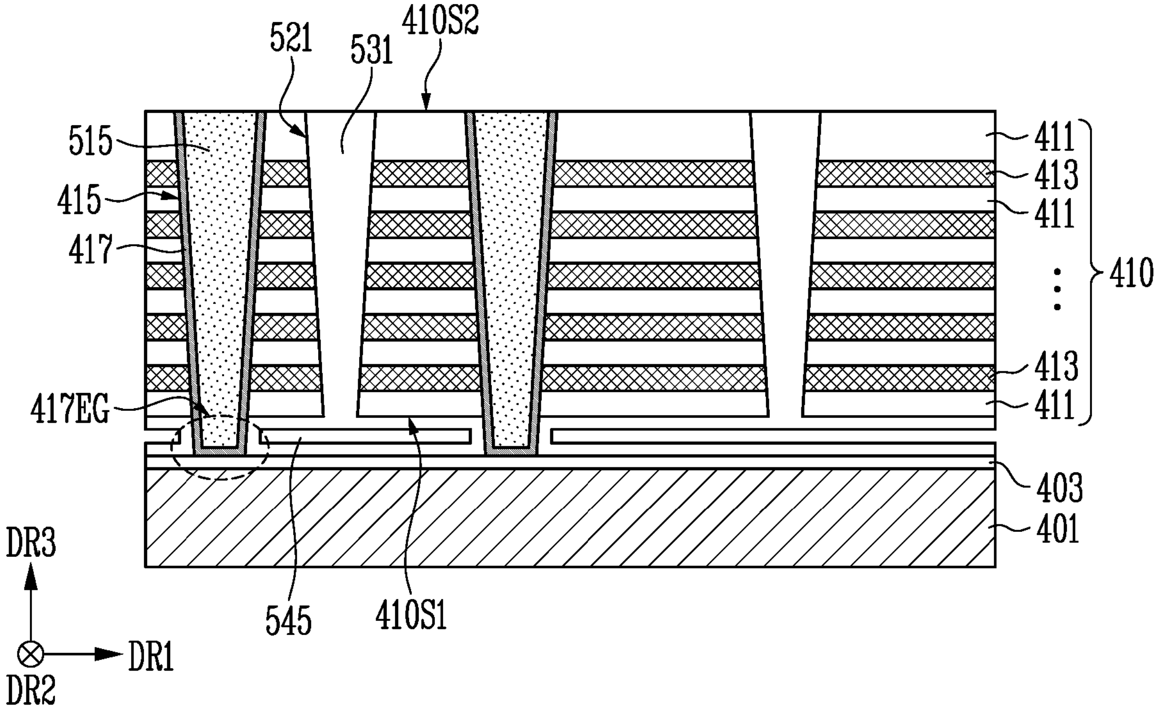
FIGS. 12A, 12B, 12C, and 12D are sectional views illustrating an embodiment of the sacrificial substrate separation process at step "S3" illustrated in FIG. 8.

Referring to FIG. 12A, the spacer layer 405, illustrated in FIG. 10C, may be selectively removed through the second opening 521 so that a space between the interface layer 403 and the second gate stacked body 410 is exposed.

In an embodiment, the deformation of the second gate stacked body 410 may be reduced or prevented by a fill structure in the second channel hole 415, the fill structure including the memory layer 417 contacting the interface layer 403.

Then, a support insulating layer 531 may be formed in a space between the interface layer 403 and the second gate stacked body 410. The support insulating layer 531 may be disposed in the space between the interface layer 403 and the second gate stacked body 410 through the second opening 521. The support insulating layer 531 may be formed to define a gap 545. The lower width of the second opening 521 may be formed to be smaller than the upper width thereof. Accordingly, before the space between the interface layer 403 and the second gate stacked body 410 is filled with the support insulating layer 531, the second opening 521 may be filled with the support insulating layer 531, and the gap 545 may be defined. The support insulating layer 531 may extend along the surface of the end 417EG of the second memory layer 417, the first surface 410S1 of the second gate stacked body 410, and the top surface of the interface layer 403.

Figure 12B:
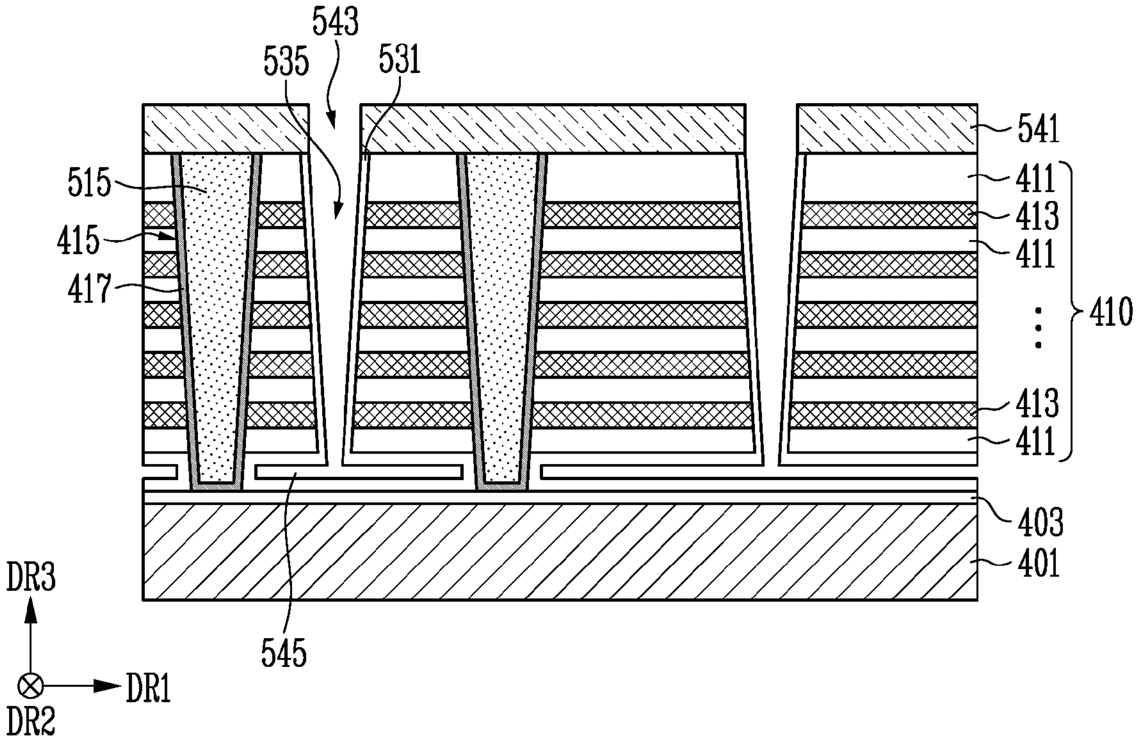

Referring to FIG. 12B, a mask pattern 541 may be formed over the second gate stacked body 410. The mask pattern 541 may include a hole-type opening 543 which opens a portion of the support insulating layer 531. The portion of the support insulating layer 531 may be etched through an etching process which uses the mask pattern 541 as an etching barrier. In this way, an auxiliary hole 535 may be formed in the support insulating layer 531. The auxiliary hole 535 may be coupled to the gap 545.

Figure 12C:
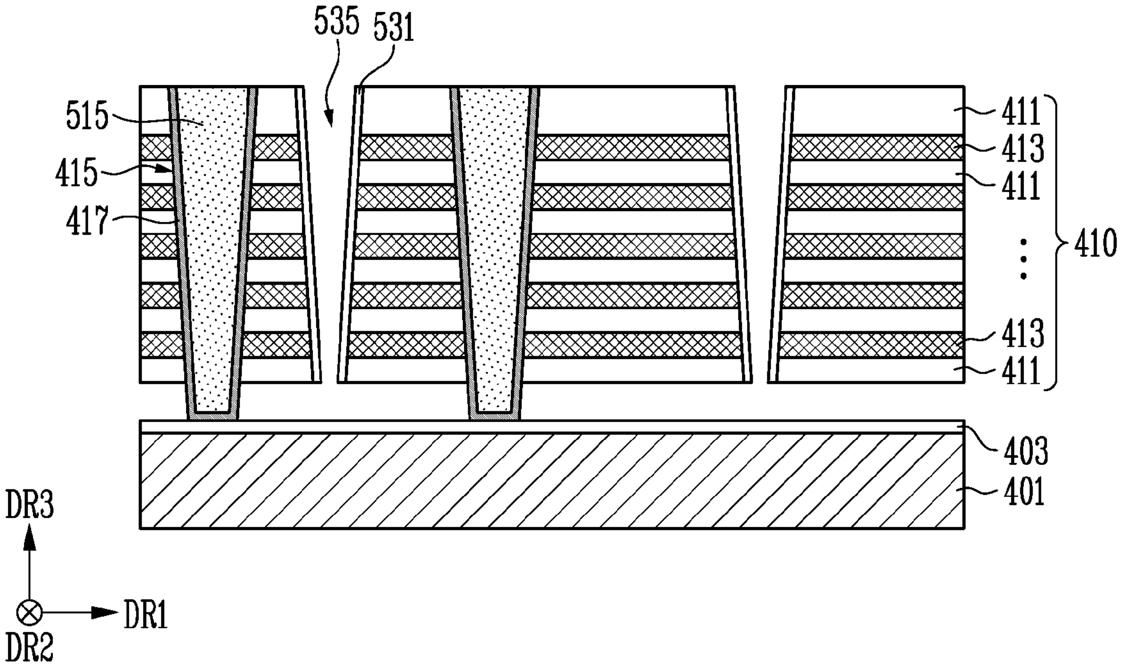

Referring to FIG. 12C, the portion of the support insulating layer 531 may be removed through the auxiliary hole 535 and the gap 545, illustrated in FIG. 12B. In this way, the interface layer 403 may be exposed.

Figure 12D:
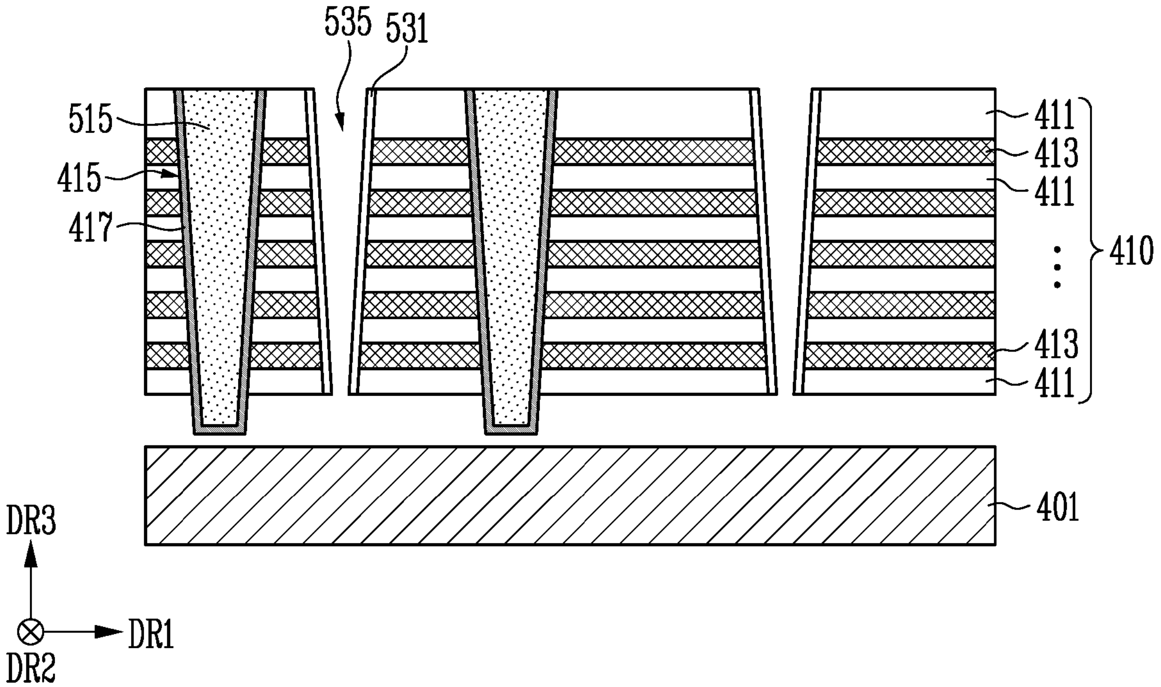

Referring to FIG. 12D, the interface layer 403 illustrated in FIG. 12C may be selectively removed. In this way, the sacrificial substrate 401 may be separated from the second gate stacked body 410.

The support insulating layer 531, passed through by the auxiliary hole 535, may remain to cover the side of each second interlayer insulating layer 411 and the side of each second conductive layer 413, as in the case of the support insulating layer SPI described above with reference to FIG. 7. Accordingly, in an embodiment, the deformation of the second gate stacked body 410 may be reduced or prevented by the remaining support insulating layer 531.

The mask pattern 541 illustrated in FIG. 12B may be removed after the interface layer 403 illustrated in FIG. 12C is exposed, or may be removed after the sacrificial substrate 401 illustrated in FIG. 12D is separated.

Figure 13:
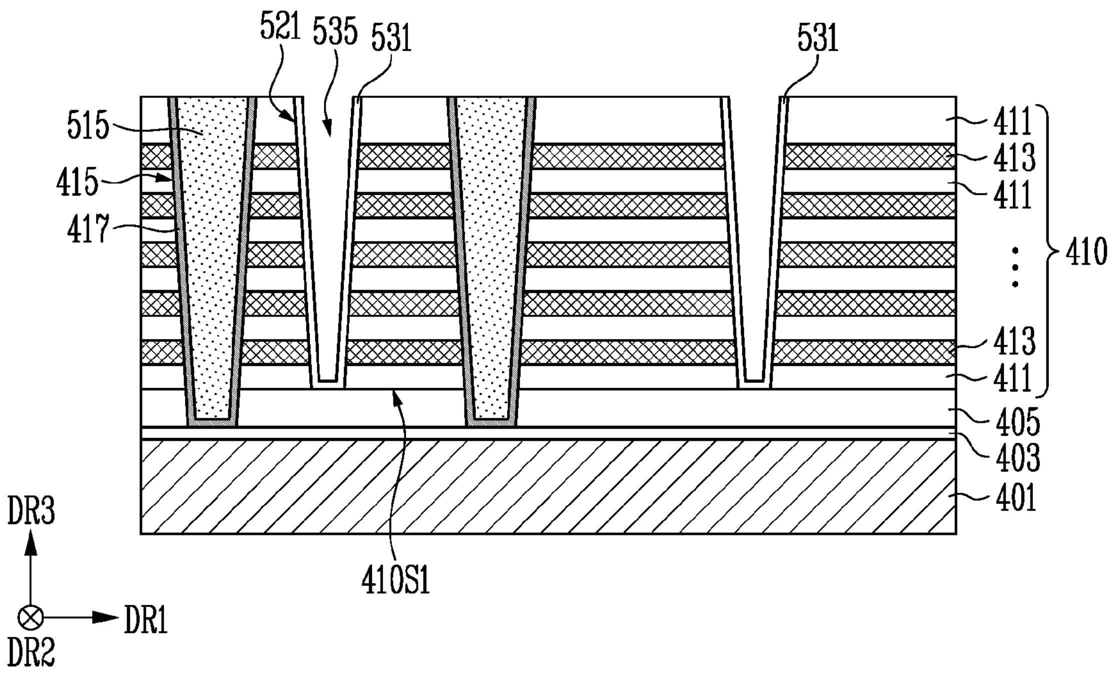
FIG. 13 is a sectional view illustrating an embodiment of the sacrificial substrate separation process at step "S3" illustrated in FIG. 8.

FIG. 13 is a sectional view illustrating an embodiment of a sacrificial substrate separation process at step “S3” illustrated in FIG. 8. More specifically, FIG. 13 illustrates a sacrificial substrate separation process using the second opening 521 formed in a trench type.

Referring to FIG. 13, a support insulating layer 531 may be formed in the second opening 521. The support insulating layer 531 may be formed over the spacer layer 405.

Subsequently, the auxiliary hole 535 may be formed in the support insulating layer 531 by etching a portion of the support insulating layer 531 through an etching process which uses the mask pattern 541, described above with reference to FIG. 12B, as an etching barrier.

Then, the spacer layer 405 is exposed by removing the portion of the support insulating layer 531 through the auxiliary hole 535, and the exposed spacer layer 405 may be selectively removed. In this way, as illustrated in FIG. 12C, the interface layer 403 may be exposed.

Thereafter, the interface layer 403 may be selectively removed through the auxiliary hole 535. In this way, as illustrated in FIG. 12D, the sacrificial substrate 401 may be separated from the second gate stacked body 410.

The support insulating layer 531, illustrated in FIG. 13, may remain to cover the side of each second interlayer insulating layer 411 and the side of each second conductive layer 413, as in the case of the support insulating layer SPI described above with reference to FIG. 7. Accordingly, in an embodiment, the deformation of the second gate stacked body 410 may be reduced or prevented by the support insulating layer 531 while the sacrificial substrate 401 is separated. After the sacrificial substrate 401 is separated, the first surface 410S1 of the second gate stacked body 410 may be exposed.

Figure 14A:
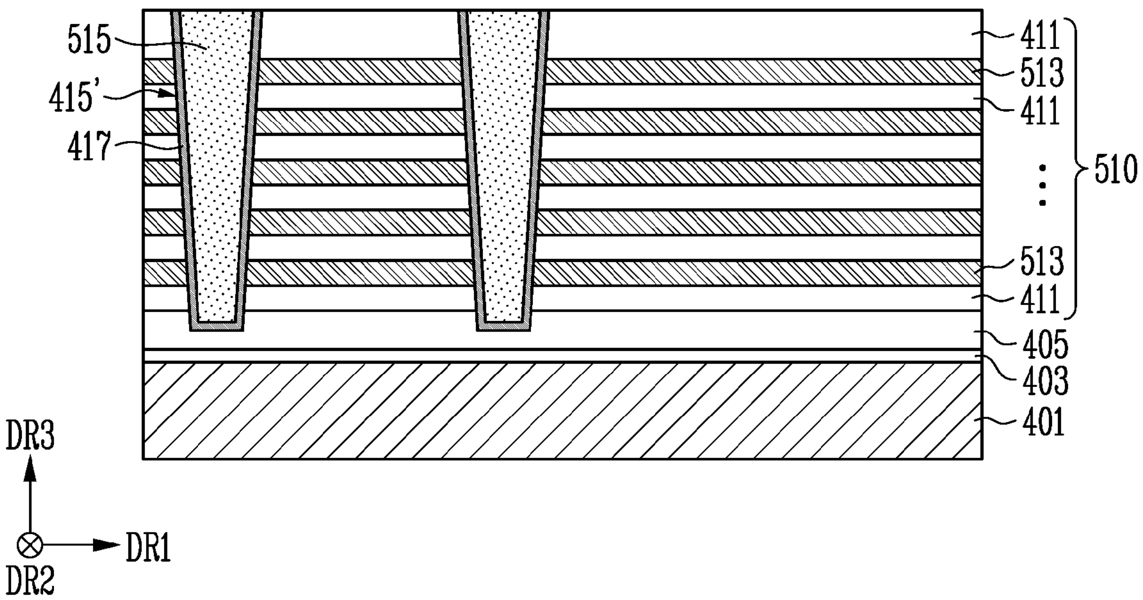
FIGS. 14A and 14B are sectional views illustrating an embodiment of step "S3" illustrated in FIG. 8.
Figure 14B:
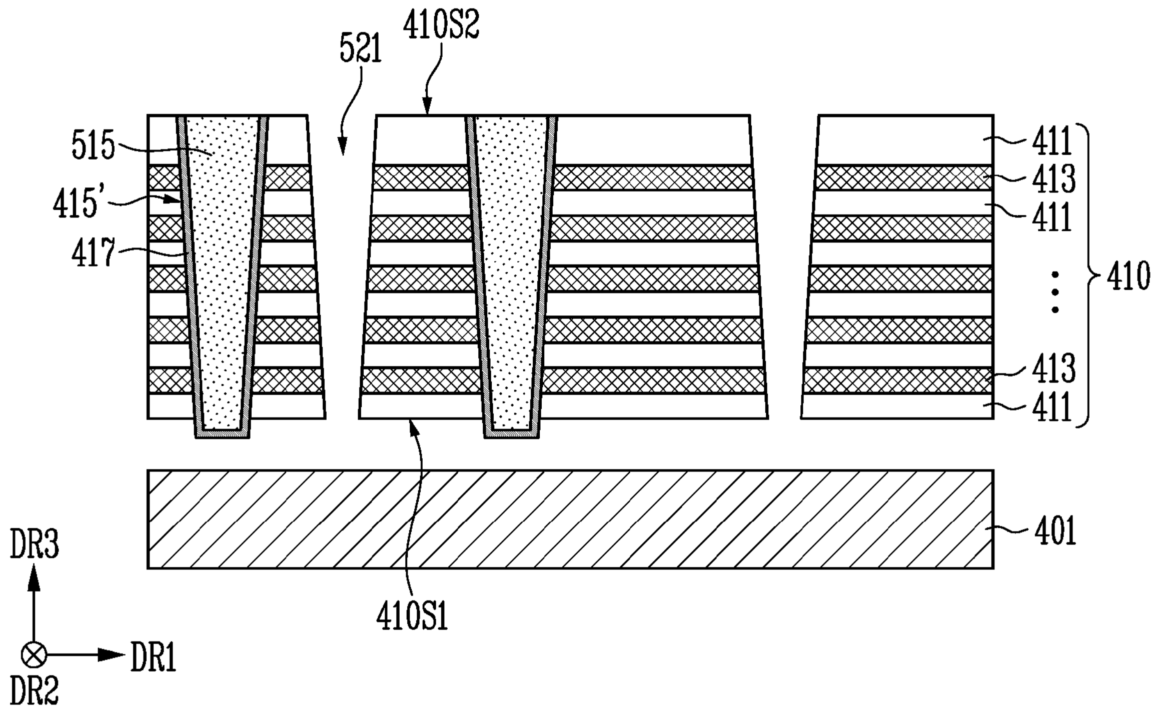

FIGS. 14A and 14B are sectional views illustrating an embodiment of step “S3” illustrated in FIG. 8.

Referring to FIG. 14A, a series of processes for cell array structure formation may be performed. As described above with reference to FIG. 10A, the cell array structure formation process may include the step of forming an interface layer 403 over a sacrificial substrate 401, the step of forming a spacer layer 405 over the interface layer 403, and the step of forming a second stacked body 510 over the spacer layer 405.

Subsequently, the cell array structure formation process may include the step of forming a second channel hole 415' to pass through the second stacked body 510. The second channel hole 415' may pass through the plurality of second interlayer insulating layers 411 and the plurality of second sacrificial layers 513 of the second stacked body 510. The second channel hole 415' may extend into the spacer layer 405. The depth of the second channel hole 415' may be varied by controlling the properties of the spacer layer 405, the etching amount of the spacer layer 405, or the like. In an embodiment, the depth of the second channel hole 415' may be controlled such that the second channel hole 415' passes through the top surface of the space layer 405, but does not pass through the bottom surface of the spacer layer 405.

Thereafter, by utilizing the processes described above with reference to FIG. 10B, the second memory layer 417 and the sacrificial pillar 515 may be formed in the second channel hole 415'.

Referring to FIG. 14B, the cell array structure formation process may include the step of forming the second opening 521, as described above with reference to FIG. 10C, and the step of defining the second gate stacked body 410 by replacing the plurality of second sacrificial layers 513, illustrated in FIG. 14A, with the plurality of second conductive layers 413 through the second opening 521. The second opening 521 may be formed in a hole type. As described above with reference to FIG. 10C, the second gate stacked body 410 may include a first surface 410S1 and a second surface 410S2 facing opposite directions.

By performing the process of separating the sacrificial substrate 401, described above with reference to FIGS. 11A and 11B after the second gate stacked body 410 is formed, the sacrificial substrate 401 may be separated from the second gate stacked body 410.

As described above, the first memory module and the second memory module may be provided using various embodiments. Thereafter, steps “S5” and “S7”, illustrated in FIG. 8, may be sequentially performed. Thereafter, steps "S5" and "S7" will be described based on an embodiment in which double layer second memory modules are stacked over the first memory module.

FIGS. 15A, 15B, 15C, and 15D are sectional views illustrating an embodiment of step "S5" illustrated in FIG. 8.

Figure 15A:
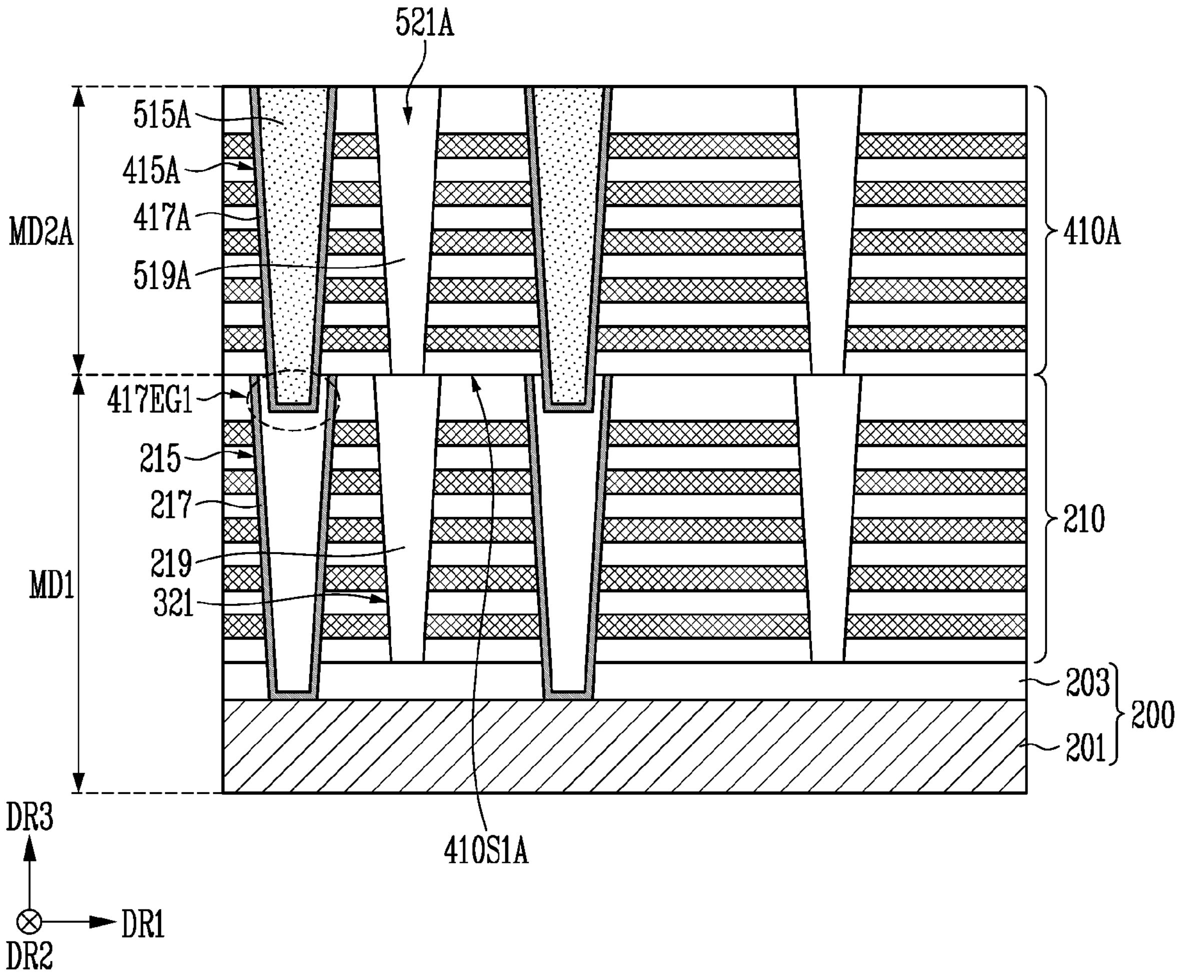
FIGS. 15A, 15B, 15C, and 15D are sectional views illustrating an embodiment of step "S5" illustrated in FIG. 8.

Referring to FIG. 15A, a first-layer second memory module MD2A may be stacked over a first memory module MD1.

The first memory module MD1 may be provided using the processes illustrated in FIGS. 9A to 9F. The first memory module MD1 may include a lower structure 200, a first gate stacked body 210 over the lower structure 200, a first channel hole 215 passing through the first gate stacked body 210 and a lower insulating layer 203 of the lower structure 200, a first memory layer 217 extending along the surface of the first channel hole 215, and a first opening 321 extending along the side of the first gate stacked body 210. A central region of the first channel hole 215 may remain as an empty space. The first memory layer 217 may contact the semiconductor layer 201 of the lower structure 200. The first memory module MD1 may include a first vertical structure 219 in the first opening 321.

The first-layer second memory module MD2A may be provided using processes according to various embodiments, with reference to FIGS. 10A, 10B, 10C, 11A, 11B, 12A, 12B, 12C, 12D, 13, 14A, and 14B. The first-layer second memory module MD2A may include a second gate stacked body 410A including a first surface 410S1A, a second channel hole 415A passing through the second gate stacked body 410A, a second memory layer 417A extending along the inner wall of the second channel hole 415A, a sacrificial pillar 515A disposed in a central region of the second channel hole 415A opened by the second memory layer 417A, and a second opening 521A extending along the side of the second gate stacked body 410A. The second memory layer 417A may include an end 417EG1 protruding beyond the first surface 410S1A of the second gate stacked body 410A. Although not illustrated in the drawing, the first-layer second memory module MD2A may further include a support insulating layer disposed in the second opening 521A.

The first surface 410S1A of the first-layer second memory module MD2A may be aligned to face the first memory module MD1. The end 417EG1 of the second memory layer 417A may be inserted into the first channel hole 215 of the first memory module MD1. The end 417EG1 of the second memory layer 417A may be spaced apart from the first memory layer 217.

After the first-layer second memory module MD2A is stacked over the first memory module MD1, a second vertical structure 519A may be formed in the second opening 521A. The second vertical structure 519A may include at least one of an insulating layer, a conductive layer, and a semiconductor layer.

Figure 15B:
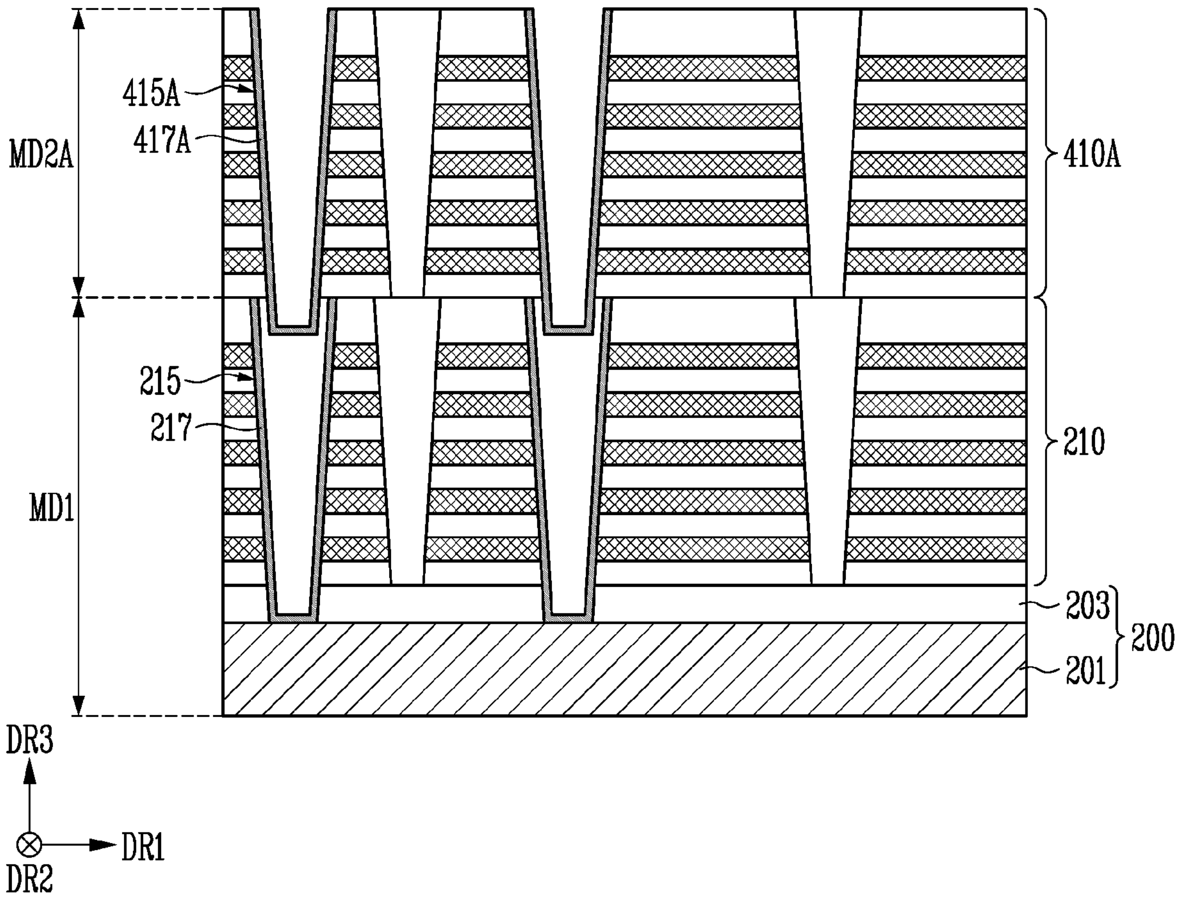

Referring to FIG. 15B, the sacrificial pillar (e.g., 515A of FIG. 15A) of the first-layer second memory module MD2A may be selectively removed. In this way, the second memory layer 417A of the first-layer second memory module MD2A may be exposed.

Figure 15C:
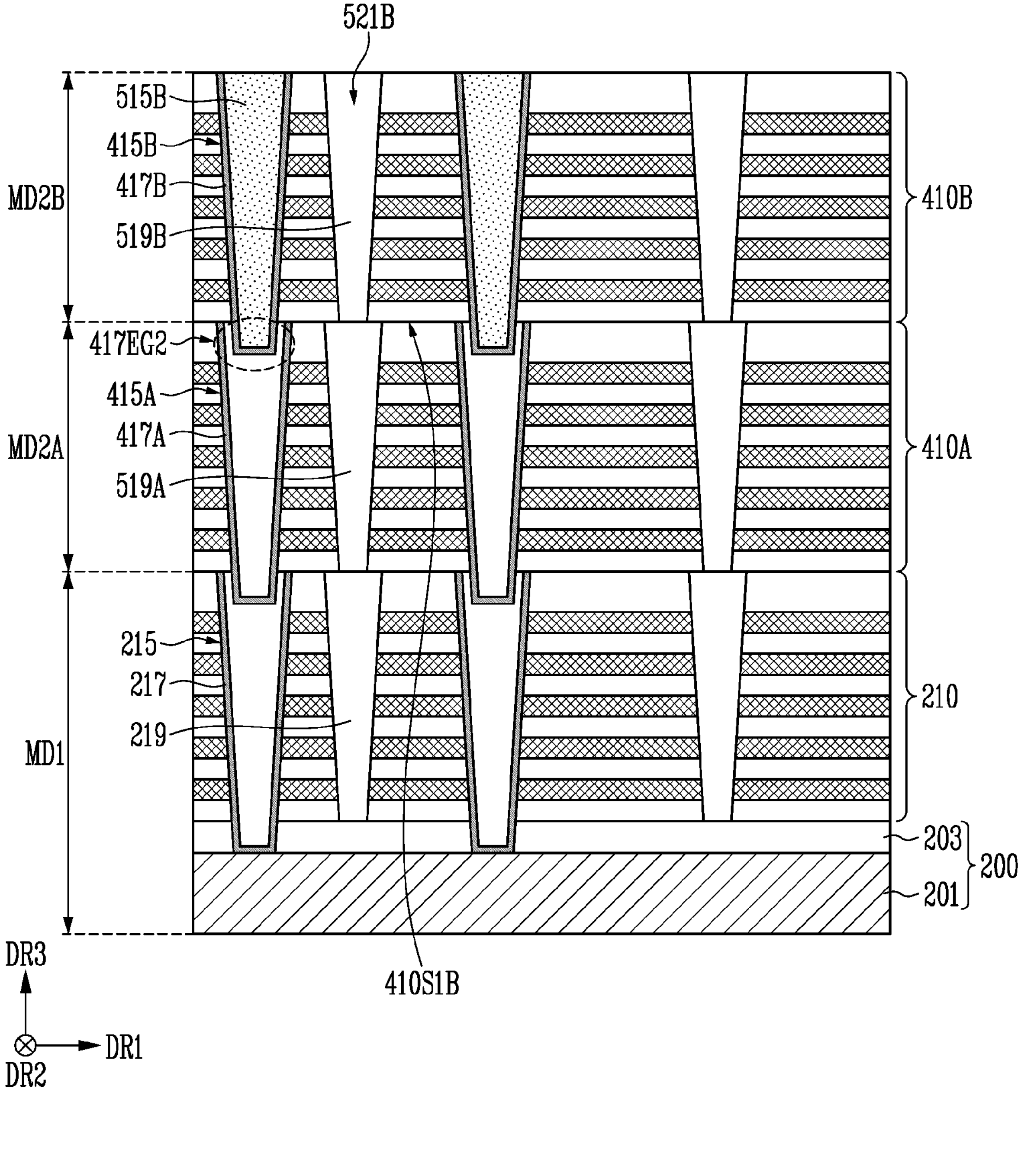

Referring to FIG. 15C, a second-layer second memory module MD2B may be stacked over the first-layer second memory module MD2A.

The second-layer second memory module MD2B may be provided using processes according to various embodiments described above with reference to FIGS. 10A, 10B, 10C, 11A, 11B, 12A, 12B, 12C, 12D, 13, 14A, and 14B. The second-layer second memory module MD2B may include a second gate stacked body 410B including a first surface 410S1B, a second channel hole 415B passing through the second gate stacked body 410B, a second memory layer 415B extending along the inner wall of the second channel hole 415B, a sacrificial pillar 515B disposed in a central region of the second channel hole 415B opened by the second memory layer 417B, and a second opening 521B extending along the side of the second gate stacked body 410B. The second memory layer 417B may include an end 417EG2 protruding beyond the first surface 410S1B of the second gate stacked body 410B. Although not illustrated in the drawing, the second-layer second memory module MD2B may further include a support insulating layer disposed in the second opening 521B.

The first surface 410S1B of the second-layer second memory module MD2B may be aligned to face the first-layer second memory module MD2A. The end 417EG2 of the second memory layer 417B may be inserted into the second channel hole 415A included in the first-layer second memory module MD2A. The end 417EG2 of the second memory layer 417B included in the second-layer second memory module MD2B may be spaced apart from the second memory layer 417A included in the first-layer second memory module MD2A.

After the second-layer second memory module MD2B is stacked over the first-layer second memory module MD2A, a third vertical structure 519B may be formed in the second opening 521B. The third vertical structure 519B may include at least one of an insulating layer, a conductive layer, and a semiconductor layer.

Figure 15D:
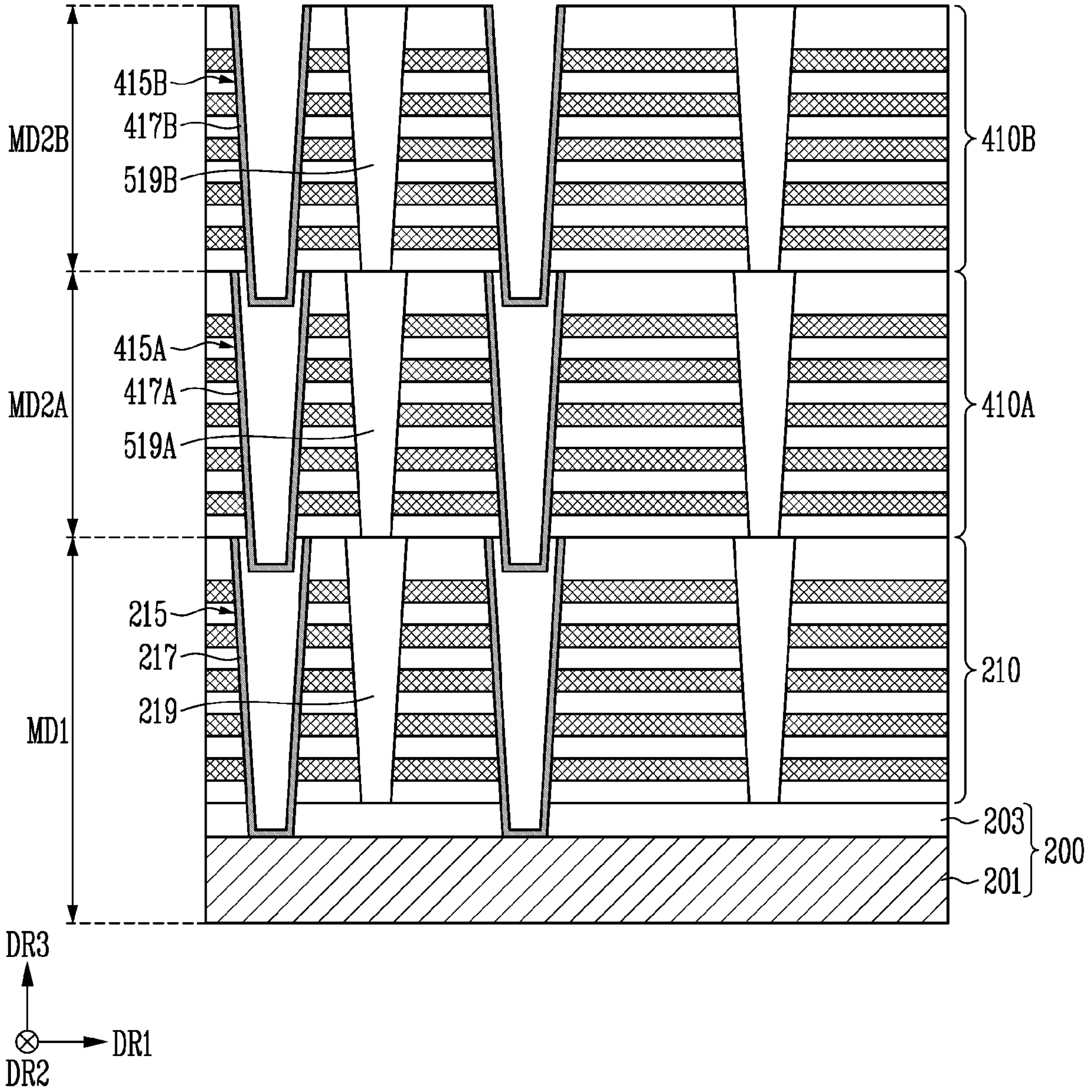

Referring to FIG. 15D, the sacrificial pillar (e.g., 515B of FIG. 15C) of the second-layer second memory module MD2B may be selectively removed. In this way, the second memory layer 417B of the second-layer second memory module MD2B may be exposed.

Figure 16A:
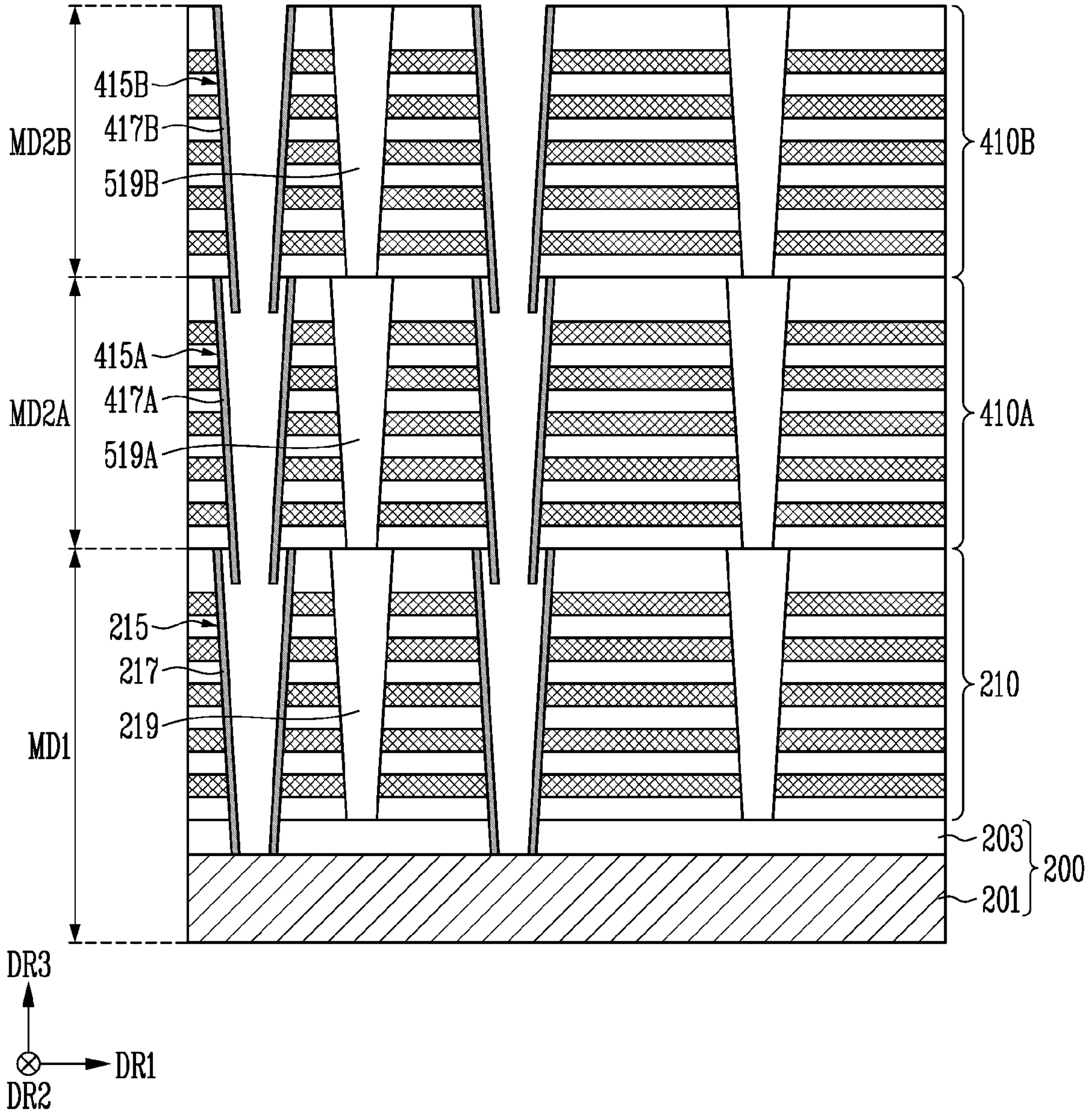
FIGS. 16A, 16B, and 16C are sectional views illustrating an embodiment of step "S7" illustrated in FIG. 8.
Figure 16B:
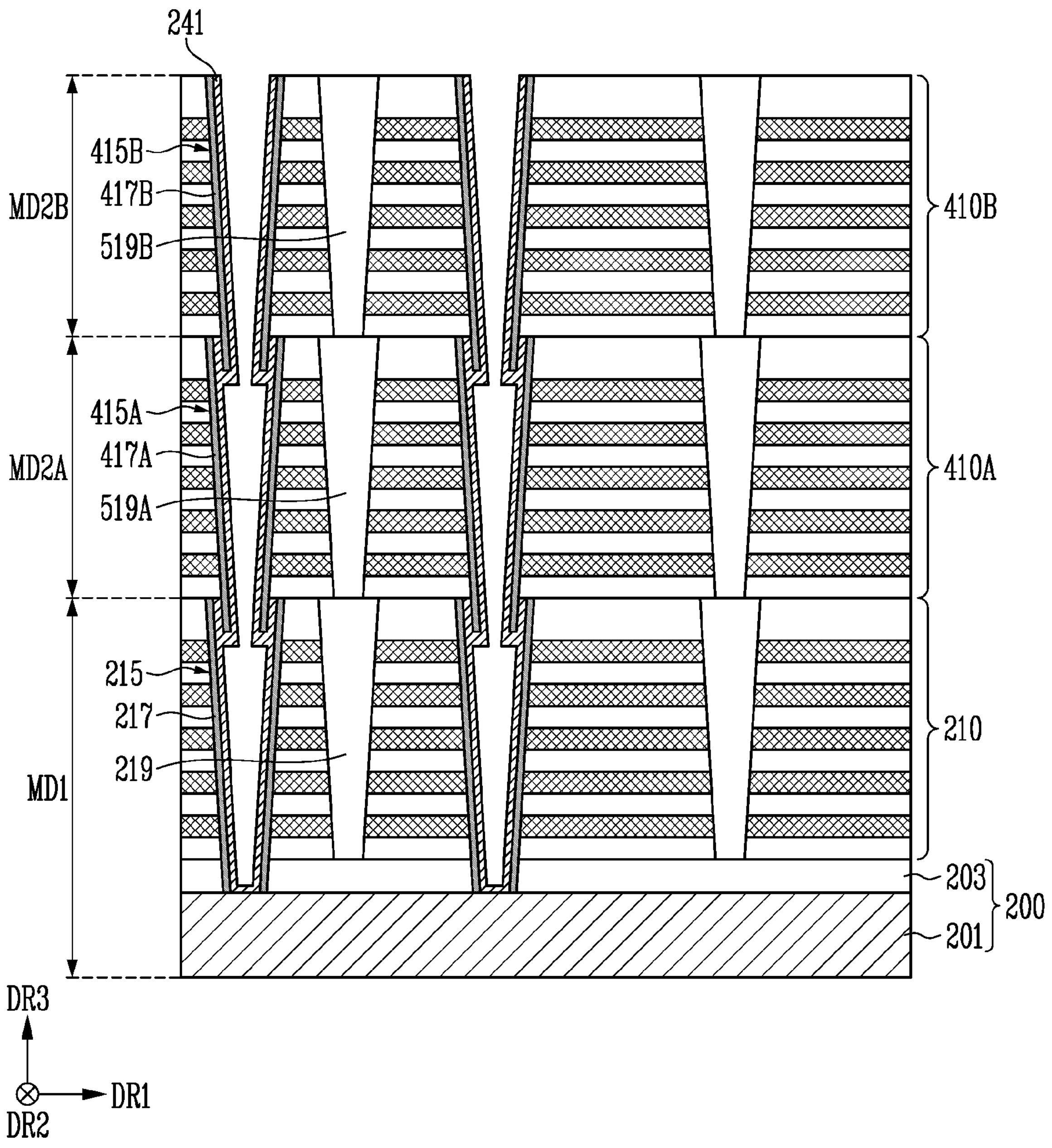
Figure 16C:
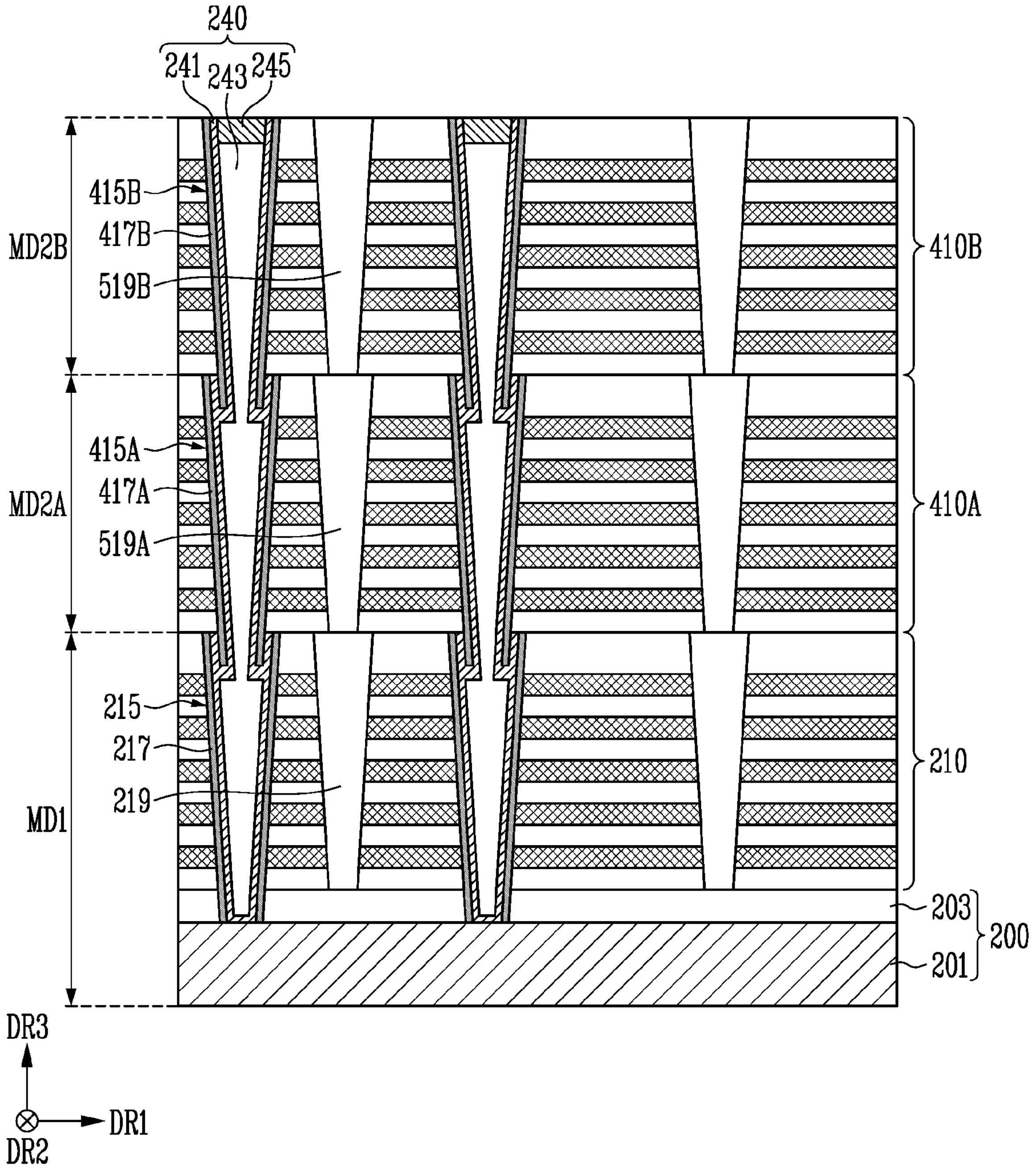

FIGS. 16A, 16B, and 16C are sectional views illustrating an embodiment of step "S7" illustrated in FIG. 8.

Referring to FIG. 16A, the bottom surface of the first memory layer 217 and respective bottom surfaces of the second memory layers 417A and 418B may be etched such that the semiconductor layer 201 of the lower structure 200 is exposed. In this way, the central region of the first channel hole 215 may be coupled to the central region of the second channel hole 415A included in the first-layer second memory module MD2A, and the central region of the second channel hole 415A included in the first-layer second memory module MD2A may be coupled to the central region of the second channel hole 415B included in the second-layer second memory module MD2B.

A process of etching the bottom surface of the first memory layer 217 and the respective bottom surfaces of the second memory layers 417A and 417B may be performed using a dry etching method in the state in which the central region of the first channel hole 215 and the respective central regions of the second channel holes 415A and 415B are empty. Accordingly, the bottom surface of the first memory layer 217 and the respective bottom surface of the second memory layers 417A and 417B may be removed.

Referring to FIG. 16B, a channel layer 241 may be formed to contact the semiconductor layer 201 of the lower structure 200. The channel layer 241 may extend along the inner wall of the first memory layer 217 and the respective inner walls of the second memory layers 417A and 417B. The channel layer 241 may extend to be interposed between the first memory layer 217 and the second memory layer 417A included in the first-layer second memory module MD2A and between the second memory layer 417A included in the first-layer second memory module MD2A and the second memory layer 417B included in the second-layer second memory module MD2B.

The channel layer 241 may be formed of a semiconductor material that can be used as channel regions of the memory cell strings. In an embodiment, the channel layer 241 may contain silicon (Si), germanium (Ge) or a mixture thereof.

The channel layer 241 may be formed in a liner type so that empty spaces are defined in the central region of the first channel hole 215 and respective central regions of the second channel holes 415A and 415B.

Referring to FIG. 16C, the empty spaces defined in the central region of the first channel hole 215 and respective central regions of the second channel holes 415A and 415B may be filled with a core insulating layer 243 and a capping layer 245. In this way, a channel pillar 240 including the channel layer 241, the core insulating layer 243, and the capping layer 245 may be formed.

The capping layer 245 may include a doped semiconductor layer. In an embodiment, the capping layer 245 may include doped silicon.

Although not illustrated in the drawings, a process of forming a plurality of interconnections including a conductive bit line contact, bit lines, etc. may be performed after the capping layer 245 is formed.

When the semiconductor layer 201 of the lower structure 200 is formed of a doped semiconductor layer, the doped semiconductor layer may contact the channel layer 241 to be used as a common source region.

When the semiconductor layer 201 of the lower structure 200 is provided as a sacrificial substrate, a process of forming a plurality of first conductive bonding pads (not illustrated) may be additionally performed after a process of forming a plurality of interconnections (not illustrated) is performed.

Although not illustrated in the drawings, the plurality of first conductive bonding pads may be bonded to a plurality of second conductive bonding pads of a structure previously provided through a bonding process. The previously provided structure may include the plurality of second conductive bonding pads and the peripheral circuit structure PS illustrated in FIG. 1B.

Figure 17A:
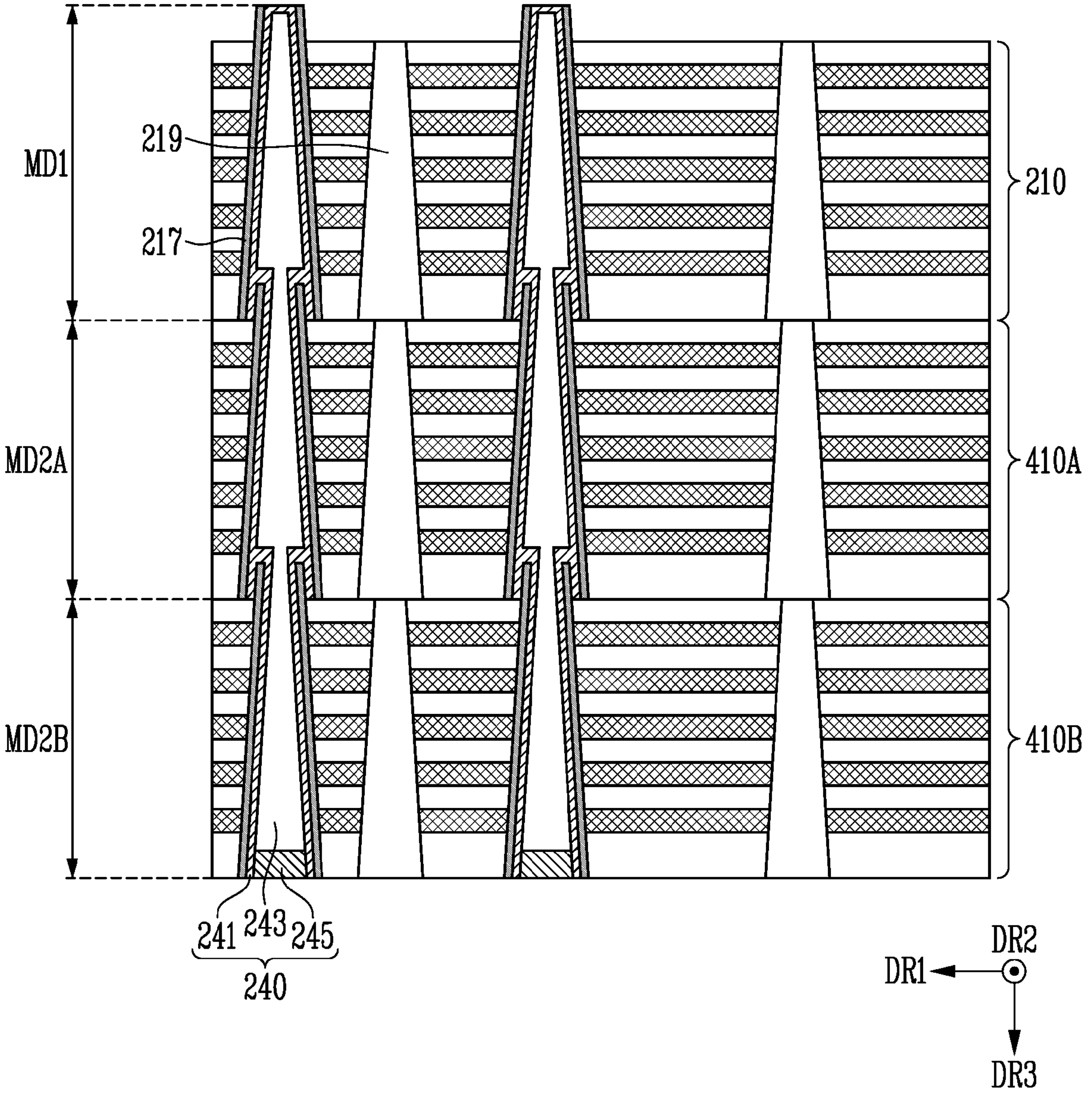
FIGS. 17A, 17B, and 17C are sectional views illustrating an embodiment of a process after step "S7" illustrated in FIG. 8.
Figure 17B:
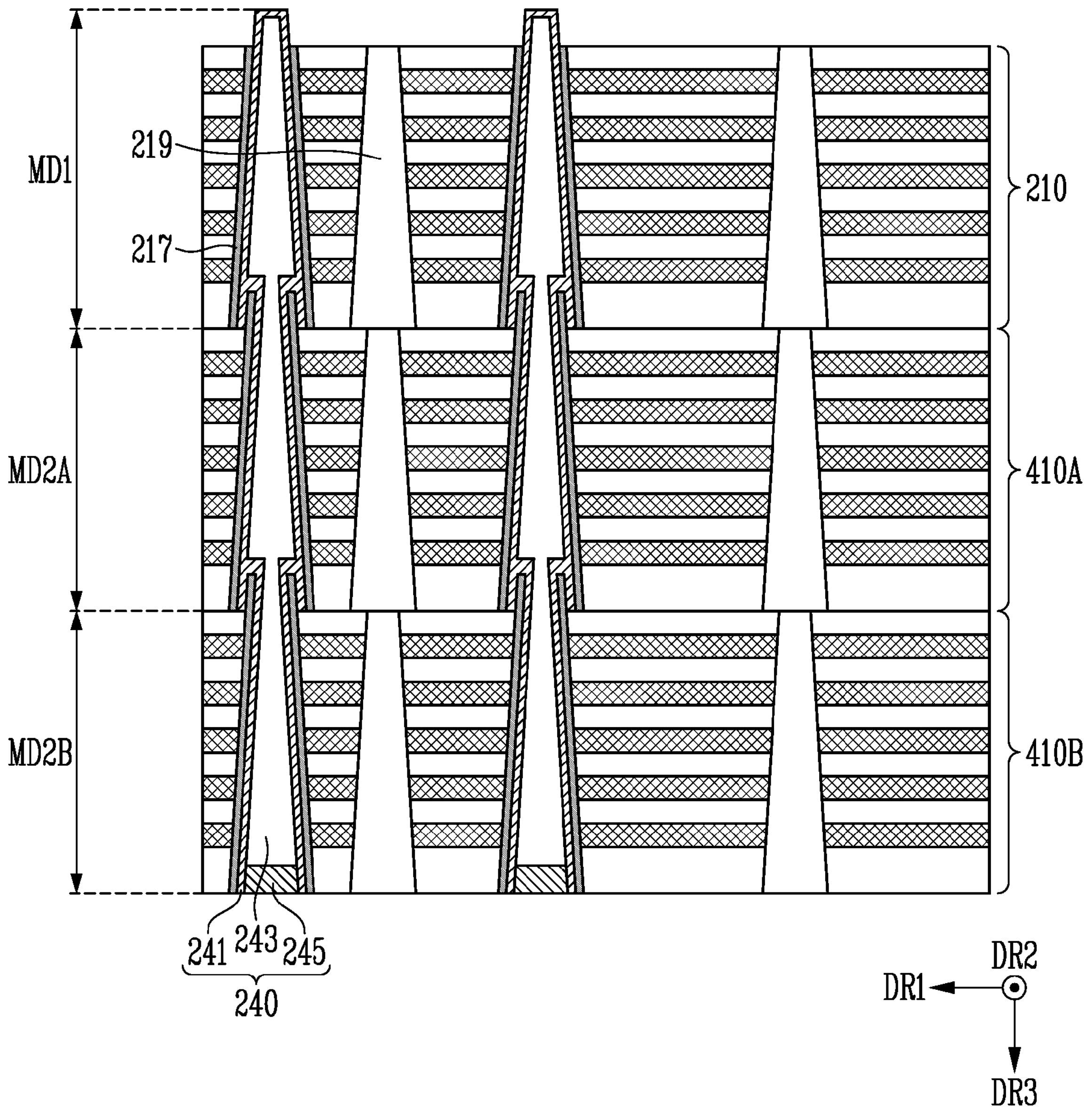
Figure 17C:
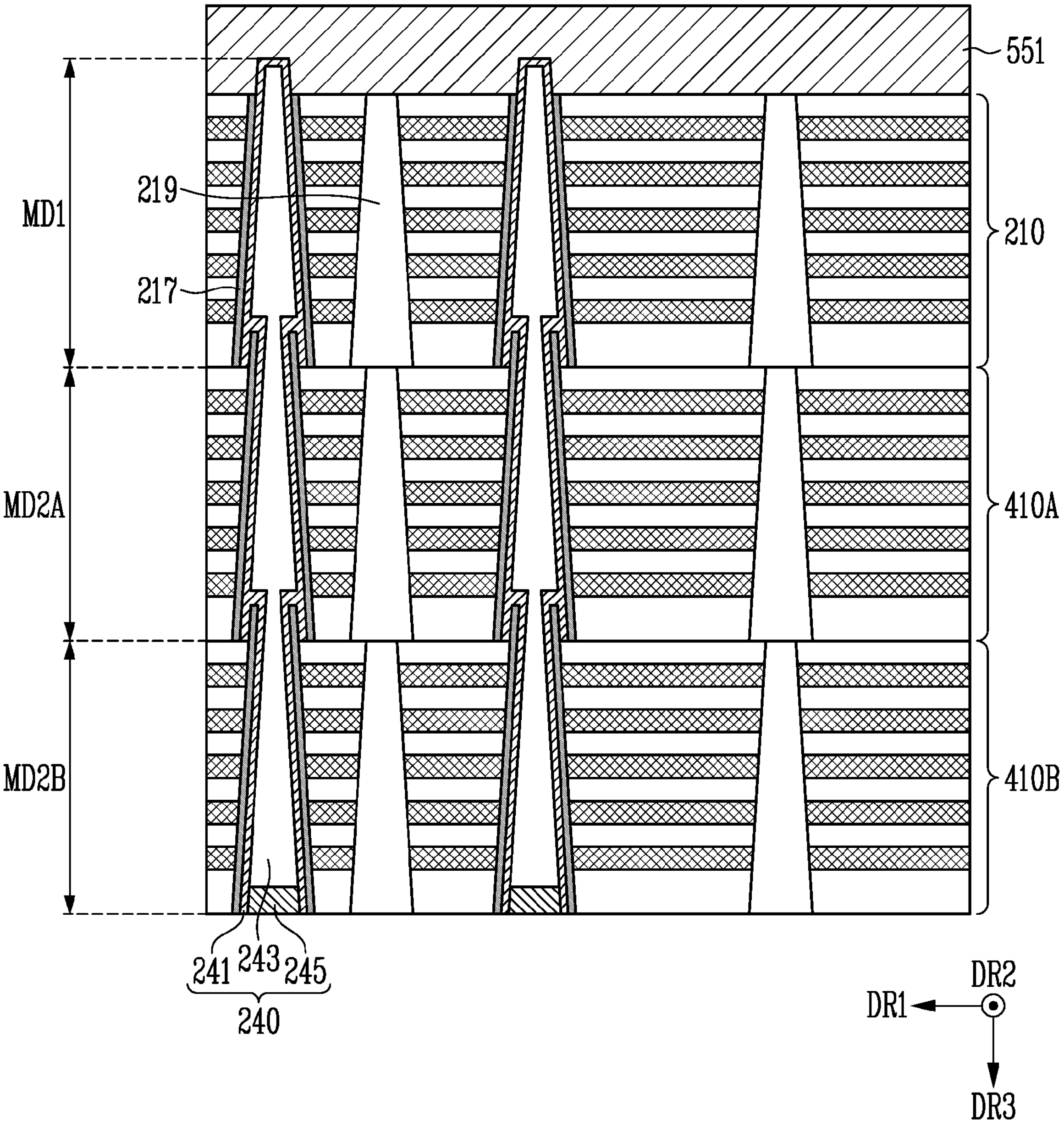

FIGS. 17A, 17B, and 17C are sectional views illustrating an embodiment of a process after step "S7" illustrated in FIG. 8. Although not illustrated in the drawings, FIG. 17A to 17C illustrate processes subsequent to the above-described bonding process.

Referring to FIG. 17A, the lower structure 200 illustrated in FIG. 16C may be removed to expose the channel layer 241. Here, a portion of the first memory layer 217 may be exposed.

Referring to FIG. 17B, the exposure area of the channel layer 241 may be increased by selectively removing the exposed portion of the first memory layer 217.

Referring to FIG. 17C, a doped semiconductor layer 551 may be formed to be coupled to the channel layer 241. The doped semiconductor layer 551 may include at least one of an n-type impurity and a p-type impurity.

Figure 18:
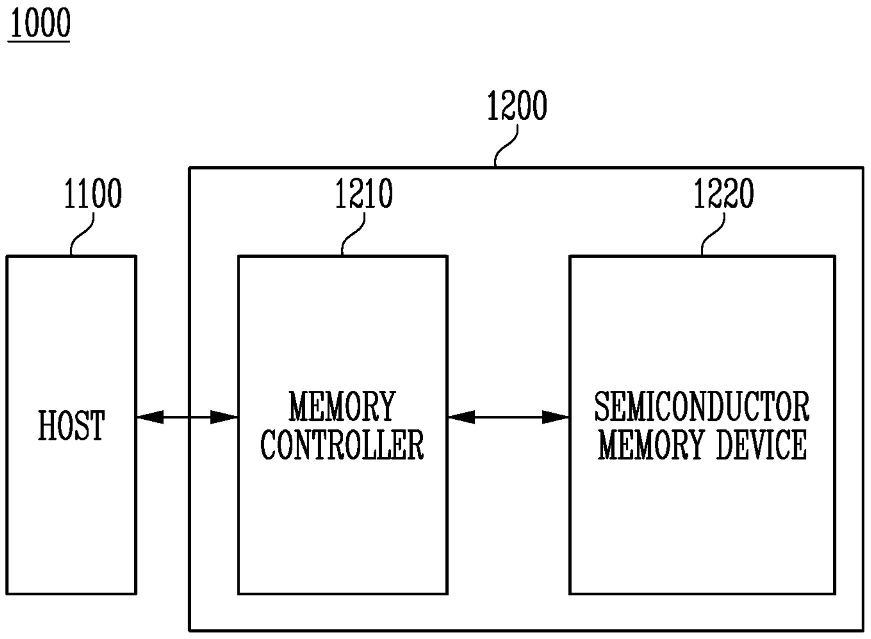
FIG. 18 is a block diagram illustrating an electronic system including a semiconductor memory device according to an embodiment of the present disclosure.

FIG. 18 is a block diagram illustrating an electronic system including a semiconductor memory device according to an embodiment of the present disclosure.

Referring to FIG. 18, an electronic system 1000 may be a computing system, a medical device, a communication device, a wearable device, a memory system, etc. The electronic system 1000 may include a host 1100 and a storage device 1200.

The host 1100 may store data in the storage device 1200 or may read data stored in the storage device 1200 based on an interface. The interface may include at least one of a double data rate (DDR) interface, a universal serial bus (USB) interface, a multimedia card (MMC) interface, an embedded MMC (eMMC) interface, a peripheral component interconnection (PCI) interface, a PCI-express (PCI-E) interface, an advanced technology attachment (ATA) interface, a serial-ATA (SATA) interface, a parallel-ATA (PATA) interface, a small computer system interface (SCSI), an enhanced small disk interface (ESDI), an integrated drive electronics (IDE) interface, a Firewire interface, a universal flash storage (UFS) interface, and a nonvolatile memory express (NVMe) interface.

The storage device 1200 may include a memory controller 1210 and a semiconductor memory device 1220. In an embodiment, the storage device 1200 may be a storage medium such as a solid state drive (SSD) or a universal serial bus (USB) memory.

The memory controller 1210 may store data in the semiconductor memory device 1220 or read data stored in the semiconductor memory device 1220 under the control of the host 1100.

The semiconductor memory device 1220 may include one memory chip or a plurality of memory chips. The semiconductor memory device 1220 may store data or output stored data under the control of the memory controller 1210.

In an embodiment, the semiconductor memory device 1220 may be a nonvolatile memory device. In an embodiment, the semiconductor memory device 1220 may include a first gate stacked body including a first channel hole, a second gate stacked body including a second channel hole, a first memory layer extending along the inner wall of the first channel hole, a second memory layer extending along the inner wall of the second channel hole, and a channel layer extending along respective inner walls of the first memory layer and the second memory layer, as described above with reference to FIG. 4. The second gate stacked body provided through a modular scheme may be aligned to overlap the first gate stacked body. An end of the second memory layer provided through the modular scheme may protrude beyond the second gate stacked body. The end of the second memory layer may be aligned to be disposed in the first channel hole.

According to various embodiments of the present disclosure, a first memory module and a second memory module may be individually formed, and thus process burden and defects attributable to the increased height of a gate stacked body may be reduced. Accordingly, in an embodiment, process defects may be improved, and thus the operational reliability of a semiconductor memory device may be enhanced.

According to various embodiments of the present disclosure, a second memory module is stacked over a first memory module, whereby the degree of integration of the semiconductor memory device may be enhanced.

What is claimed is:

1. A semiconductor memory device, comprising:

a first gate stacked body including a first channel hole;

a second gate stacked body overlapping the first gate stacked body and including a second channel hole;

a first memory layer extending along an inner wall of the first channel hole; and a second memory layer extending along an inner wall of the second channel hole and including an end protruding into the first channel hole.

2. The semiconductor memory device according to claim 1, further comprising:

a channel layer extending along an inner wall of the first memory layer and extending along an inner wall of the second memory layer.

3. The semiconductor memory device according to claim 2, wherein the channel layer includes a groove into which the end of the second memory layer is inserted.

4. The semiconductor memory device according to claim 2, wherein the channel layer comprises:

a first vertical portion interposed between the first memory layer and the end of the second memory layer and extending along the inner wall of the first memory layer;

a second vertical portion extending along the inner wall of the second memory layer; and a connection portion extending along a bottom surface of the second memory layer, and extending from the first vertical portion towards the second vertical portion.

5. The semiconductor memory device according to claim 1, wherein the end of the second memory layer is disposed closer to a center of the first channel hole than the first memory layer and is spaced apart from the first memory layer.

6. The semiconductor memory device according to claim 1, wherein:

a width of the first channel hole becomes larger in a direction closer to a boundary between the first gate stacked body and the second gate stacked body, and a width of the second channel hole becomes smaller in a direction closer to the boundary between the first gate stacked body and the second gate stacked body.

7. The semiconductor memory device according to claim 1, wherein each of the first gate stacked body and the second gate stacked body comprises:

a plurality of interlayer insulating layers and a plurality of conductive layers that are alternately stacked in a direction of arrangement of the first gate stacked body and the second gate stacked body.

8. The semiconductor memory device according to claim 7, wherein:

each of the plurality of interlayer insulating layers comprises:

a first area overlapping the plurality of conductive layers; and a second area extending from the first area, and the second area of the interlayer insulating layer is not overlap the plurality of conductive layers and is passed through by a hole.

9. The semiconductor memory device according to claim 7, further comprising:

a support insulating layer extending along sides of the plurality of interlayer insulating layers and sides of the plurality of conductive layers, wherein the support insulating layer is passed through by an auxiliary hole.

10. The semiconductor memory device according to claim 2, further comprising:

a doped semiconductor layer overlapping the second gate stacked body with the first gate stacked body interposed between the doped semiconductor layer and the second gate stacked body, and coupled to the channel layer;

a bit line overlapping the first gate stacked body with the second gate stacked body interposed between the bit line and the first gate stacked body, and coupled to the channel layer; and a peripheral circuit structure disposed adjacent to the doped semiconductor layer.

11. The semiconductor memory device according to claim 2, further comprising:

a doped semiconductor layer overlapping the second gate stacked body with the first gate stacked body interposed between the doped semiconductor layer and the second gate stacked body and coupled to the channel layer;

a bit line overlapping the first gate stacked body with the second gate stacked body interposed between the bit line and the first gate stacked body and coupled to the channel layer; and a peripheral circuit structure disposed adjacent to the bit line.

* * * * *